United States Patent
Kim et al.

(10) Patent No.: US 11,392,454 B2
(45) Date of Patent: Jul. 19, 2022

(54) MEMORY CONTROLLERS, MEMORY SYSTEMS AND MEMORY MODULES

(71) Applicant: Samsung Electronics Co., Ltd., Suwon-si (KR)

(72) Inventors: Hoyoun Kim, Seoul (KR); Kijun Lee, Seoul (KR); Chanki Kim, Ansan-si (KR); Myungkyu Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/132,028

(22) Filed: Dec. 23, 2020

(65) Prior Publication Data
US 2021/0357287 A1 Nov. 18, 2021

(30) Foreign Application Priority Data
May 12, 2020 (KR) .................. 10-2020-0056319

(51) Int. Cl.
*G06F 11/10* (2006.01)
*H03M 13/00* (2006.01)
*H03M 13/15* (2006.01)

(52) U.S. Cl.
CPC ..... *G06F 11/1068* (2013.01); *H03M 13/1575* (2013.01); *H03M 13/616* (2013.01)

(58) Field of Classification Search
None
See application file for complete search history.

(56) References Cited

U.S. PATENT DOCUMENTS

| RE33,332 E | 9/1990 | Furuya et al. |
| 5,003,539 A * | 3/1991 | Takemoto ............. H03M 13/13 714/785 |
| 5,315,601 A | 5/1994 | Lee et al. |
| 6,101,614 A | 8/2000 | Gonzales et al. |

(Continued)

FOREIGN PATENT DOCUMENTS

KR  10-0881192 B1  1/2009

OTHER PUBLICATIONS

Taiwanese Office Action dated Mar. 28, 2022 issued in corresponding Taiwanese Patent Application No. 110100521.

*Primary Examiner* — Phung M Chung
(74) *Attorney, Agent, or Firm* — Harness, Dickey & Pierce, P.L.C.

(57) ABSTRACT

A memory controller to control a memory module includes an error correction code (ECC) engine, a central processing unit to control the ECC engine and an error managing circuit. The ECC engine performs an ECC decoding on a read codeword set from the memory module to generate a first syndrome and a second syndrome in a read operation, corrects correctable error in a user data set based on the first syndrome and the second syndrome and provides the error management circuit with the second syndrome associated with the correctable error. The error managing circuit counts error addresses associated with correctable errors detected through read operations, stores second syndromes associated with the correctable errors by accumulating the second syndromes, determines attribute of the correctable errors based on the counting and the accumulated second syndromes, and determine an error management policy on a memory region associated with the correctable errors.

17 Claims, 22 Drawing Sheets

(56) References Cited

U.S. PATENT DOCUMENTS

| | | |
|---|---|---|
| 7,949,927 B2 | 5/2011 | Park et al. |
| 7,949,931 B2 * | 5/2011 | Lastras-Montano .......................... H03M 13/1515 714/785 |
| 8,041,990 B2 | 10/2011 | O'Connor et al. |
| 8,327,236 B2 | 12/2012 | Ukai |
| 8,468,422 B2 | 6/2013 | Chessin et al. |
| 9,043,655 B2 | 5/2015 | Kimura |
| 9,043,674 B2 | 5/2015 | Wu et al. |
| 9,880,896 B2 | 1/2018 | Coteus et al. |
| 11,163,640 B2 * | 11/2021 | Eun .................... G11C 29/4401 |
| 2005/0022091 A1 | 1/2005 | Holman |
| 2008/0163032 A1 | 7/2008 | Lastras-Montano |
| 2021/0026728 A1 * | 1/2021 | Kim .................... G06F 11/1068 |

* cited by examiner

FIG. 8
OSMb

```
     0 0 0 0 0 0 0 0 0 0 0 0 0 0 0 1
     1 0 0 0 0 0 0 0 0 0 0 0 0 0 0 1
     0 1 0 0 0 0 0 0 0 0 0 0 0 0 0 0
     0 0 1 0 0 0 0 0 0 0 0 0 0 0 0 1
     0 0 0 1 0 0 0 0 0 0 0 0 0 0 0 0
     0 0 0 0 1 0 0 0 0 0 0 0 0 0 0 0
     0 0 0 0 0 1 0 0 0 0 0 0 0 0 0 0
p    0 0 0 0 0 0 1 0 0 0 0 0 0 0 0 0
     0 0 0 0 0 0 0 1 0 0 0 0 0 0 0 0
     0 0 0 0 0 0 0 0 1 0 0 0 0 0 0 0
     0 0 0 0 0 0 0 0 0 1 0 0 0 0 0 0
     0 0 0 0 0 0 0 0 0 0 1 0 0 0 0 0
     0 0 0 0 0 0 0 0 0 0 0 1 0 0 0 1
     0 0 0 0 0 0 0 0 0 0 0 0 1 0 0 0
     0 0 0 0 0 0 0 0 0 0 0 0 0 1 0 0
     0 0 0 0 0 0 0 0 0 0 0 0 0 0 1 0
                    p
```

FIG. 9
ZSM

ISM

| | | | | | | | | | | | | | | | |
|---|---|---|---|---|---|---|---|---|---|---|---|---|---|---|---|
|1|0|0|0|0|0|0|0|0|0|0|0|0|0|0|0|
|0|1|0|0|0|0|0|0|0|0|0|0|0|0|0|0|
|0|0|1|0|0|0|0|0|0|0|0|0|0|0|0|0|
|0|0|0|1|0|0|0|0|0|0|0|0|0|0|0|0|
|0|0|0|0|1|0|0|0|0|0|0|0|0|0|0|0|
|0|0|0|0|0|1|0|0|0|0|0|0|0|0|0|0|
|0|0|0|0|0|0|1|0|0|0|0|0|0|0|0|0|
|0|0|0|0|0|0|0|1|0|0|0|0|0|0|0|0|
|0|0|0|0|0|0|0|0|1|0|0|0|0|0|0|0|
|0|0|0|0|0|0|0|0|0|1|0|0|0|0|0|0|
|0|0|0|0|0|0|0|0|0|0|1|0|0|0|0|0|
|0|0|0|0|0|0|0|0|0|0|0|1|0|0|0|0|
|0|0|0|0|0|0|0|0|0|0|0|0|1|0|0|0|
|0|0|0|0|0|0|0|0|0|0|0|0|0|1|0|0|
|0|0|0|0|0|0|0|0|0|0|0|0|0|0|1|0|
|0|0|0|0|0|0|0|0|0|0|0|0|0|0|0|1| p (rows) × p (columns)

FIG. 17

| R_CNT | C_CNT | BN_CNT | CH_CNT |
|---|---|---|---|
| 1 | 0 | 0 | 0 |

| | EAI1 | ESB1 |
|---|---|---|
| Idx11 → | BA/RA/CA_11 | CID1 |
| Idx12 → | BA/RA/CA_12 | CID1 |
| | 411 | 413 |

FIG. 20

450a / SDR_M

DQP →

BL ↓

| 1 | 0 | 0 | 0 |
|---|---|---|---|
| 0 | 0 | 0 | 0 |
| 0 | 0 | 0 | 0 |
| 0 | 0 | 0 | 0 |

| 0 | 0 | 1 | 0 |
|---|---|---|---|
| 0 | 0 | 0 | 0 |
| 0 | 0 | 0 | 0 |
| 0 | 0 | 0 | 0 |

FIG. 21

460a / SDR_M_ACM

DQP →

BL ↓

| 63+1 | 45 | 13 | 8 |
|---|---|---|---|
| 0 | 0 | 0 | 0 |
| 0 | 0 | 0 | 0 |
| 0 | 0 | 0 | 0 |

| 48 | 32 | 11+1 | 21 |
|---|---|---|---|
| 0 | 0 | 0 | 0 |
| 0 | 0 | 0 | 0 |
| 0 | 0 | 0 | 0 |

MEMORY CONTROLLERS, MEMORY SYSTEMS AND MEMORY MODULES

CROSS-REFERENCE TO RELATED APPLICATIONS

This application claims priority under 35 U.S.C. § 119 to Korean Patent Application No. 10-2020-0056319, filed on May 12, 2020, the entire contents of which are incorporated by reference herein in its entirety.

BACKGROUND

Some example embodiments relate to memories, and more particularly, to memory controllers, memory systems including the same, and/or memory modules.

A memory device may be implemented using a semiconductor such as silicon (Si), germanium (Ge), gallium arsenide (GaAs), indium phosphide (InP), and/or the like. Memory devices are typically divided between volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, and/or the like of a computing system.

Recently, a plurality of DRAMs are provided in a type of a memory module, e.g. a number of packaged chips provided on a printed circuit board, such as a dual in-line memory module (DIMM). There is need or desire for efficiently correcting and/or managing errors occurring in the memory module.

SUMMARY

Some example embodiments provide a memory controller capable of managing errors occurring in a memory module, efficiently.

Some example embodiments provide a memory system that includes a memory controller capable of managing errors occurring in a memory module, efficiently.

Some example embodiments provide a memory module capable of managing errors occurring in the memory module, efficiently.

According to some example embodiments, a memory controller includes the memory controller comprising an error correction code (ECC) engine circuitry, a central processing unit (CPU) configured to control the ECC engine, and an error managing circuitry. The memory controller circuitry is configured to, perform an ECC decoding on a read codeword set from the memory module to generate a first syndrome and a second syndrome, the first syndrome and the second syndrome generated in a read operation, correct an correctable error in a user data set in the read codeword set based on the first syndrome and the second syndrome, provide the error management circuitry with the second syndrome associated with the correctable error, count error addresses associated with correctable errors detected through a plurality of read operations, store the second syndromes associated with the correctable errors by accumulating the second syndromes, determine an attribute of the correctable errors based on a result of the counting and on the accumulation of the second syndromes, and determine an error management policy on at least one memory region associated with the correctable errors, the at least one memory region associated with the plurality of data chips.

According to some example embodiments, a memory system includes a memory module including a plurality of data chips, a first parity chip, and a second parity chip, and a memory controller circuitry configured to control the memory module. The memory controller circuitry an error correction code (ECC) engine, a central processing unit (CPU) configured to control the ECC engine, and an error managing circuit. The memory controller circuitry is configured to, perform an ECC decoding on a read codeword set from the memory module to generate a first syndrome and a second syndrome in a read operation, correct an correctable error in a user data set in the read codeword set based on the first syndrome and the second syndrome, count error addresses associated with correctable errors detected through a plurality of read operations, accumulate second syndromes associated with the correctable errors to store the second syndromes, determine an attribute of the correctable errors based on comparison of a result of the counting and the accumulation of the second syndromes, and determine an error management policy on at least one memory region associated with the correctable errors, of the plurality of data chips.

According to some example embodiments, a memory module includes a plurality of data chips configured to store a user data set and meta data, a first parity chip and a second parity chip configured to store a first parity data and a second parity data, respectively, the first parity data and the parity data being generated based on the user data set and the meta data, and a buffer chip configured to provide the user data set and the meta data to the plurality of data chips based on a command and an address provided from an external memory controller and configured to provide the first parity data and the second parity data to the first parity chip and the second parity chip, respectively. The buffer chip includes an error correction code (ECC) engine circuitry, a memory management circuitry configured to control the ECC engine, and an error managing circuitry. The ECC engine circuitry is configured to, perform an ECC decoding on a read codeword set from the plurality of data chips, the first parity chip and the second parity chip to generate a first syndrome and a second syndrome in a read operation, correct an correctable error in a user data set in the read codeword set based on the first syndrome and the second syndrome, and provide the error management circuit with the second syndrome associated with the correctable error. The error managing circuitry is configured to, count error addresses associated with correctable errors detected through a plurality of read operations, store second syndromes associated with the correctable errors by accumulating the second syndromes, determine attribute of the correctable errors based on comparison of a result of the counting and the accumulation of the second syndromes, and determine an error management policy on at least one memory region associated with the correctable errors, of the plurality of data chips.

Accordingly, the error managing circuit may count error addresses associated with correctable errors, may store the second syndromes associated with the correctable errors by accumulating the second syndromes, may determine attribute of the correctable errors based on a result of the counting and the accumulation of the second syndromes, and may determine an error management policy on at least one memory region associated with the correctable errors, of the plurality of data chips.

BRIEF DESCRIPTION OF THE DRAWINGS

The above and other features of the present disclosure will become more apparent by describing in detail some example embodiments thereof with reference to the accompanying drawings.

FIG. 8 illustrates an example of a base offset sub matrix which is used for generating the offset sub matrixes in the first parity sub matrix.

FIG. 9 illustrates an example of a zero sub matrix in the parity generation matrix in FIG. 7.

FIG. 10 illustrates an example of a unit sub matrix in the parity generation matrix in FIG. 7.

FIG. 17 illustrates an example of the counting value in FIG. 16 according to some example embodiments.

FIG. 18 illustrates an example of the error address register in FIG. 16 according to some example embodiments.

FIG. 20 illustrates an example of the syndrome register in the error manager of FIG. 19 according to some example embodiments.

FIG. 21 illustrates an example of the syndrome accumulation register in the error manager of FIG. 19 according to some example embodiments.

DETAILED DESCRIPTION OF EXAMPLE EMBODIMENTS

Figure 1:
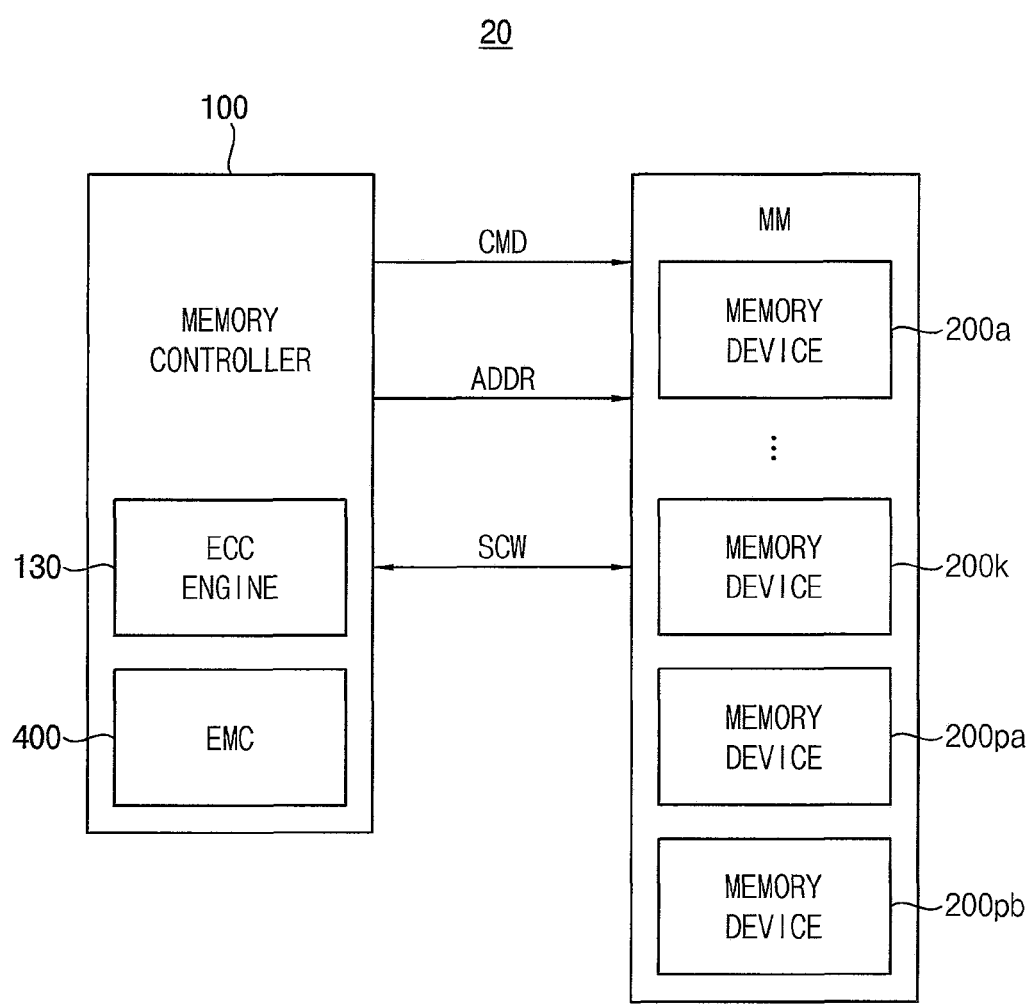
FIG. 1 is a block diagram illustrating a memory system according to some example embodiments.

Example embodiments will be described more fully hereinafter with reference to the accompanying drawings. Like reference numerals may refer to like elements throughout the accompanying drawings.

FIG. 1 is a block diagram illustrating a memory system according to some example embodiments.

Referring to FIG. 1, a memory system 20 may include a memory controller 100 and a memory module MM. The memory module MM includes a plurality of memory chips 200a~200k, 200pa, and 200pb. The plurality of memory chips 200a~200k, 200pa and 200pb includes a plurality of data chips 200a~200k and a first parity chip 200pa and a second parity chip 200pb. Each of the memory chips 200a~200k, 200pa, and 200pb may be referred to as a semiconductor memory device.

The memory controller 100 may control an overall operation of the memory system 20. The memory controller 100 may control an overall data exchange between a host and the plurality of memory chips 200a~200k, 200pa and 200pb. For example, the memory controller 100 may write data in the plurality of memory chips 200a~200k, 200pa and 200pb and/or read data from the plurality of memory chips 200a~200k, 200pa and 200pb in response to a request from the host.

Alternatively or additionally, the memory controller 100 may issue operation commands to the plurality of memory chips 200a~200k, 200pa and 200pb for controlling the plurality of memory chips 200a~200k, 200pa, and 200pb.

In some example embodiments, each of the plurality of memory chips 200a~200k, 200pa, and 200pb includes volatile memory cells such as a dynamic random access memory (DRAM).

In some example embodiments, a number of the data chips 200a~200k may be 16. However, the number of the data chips 200a~200k is not limited thereto, and may be more than, or less than, 16, and may be a power of two, or may not be a power of two. In some example embodiments, each of the data chips 200a~200k may be referred to as a data memory, and each of the parity chips 200pa and 200pb may be referred to as an error correction code (ECC) memory, or a redundant memory.

The memory controller 100 transmits an address ADDR and a command CMD to the memory module MM and may exchange a codeword set SCW from the memory module MM.

The memory controller 100 may include an error correction code (ECC) engine 130, and the ECC engine 130 may perform an ECC encoding on a user data set and a meta data set so as to generate a parity data set using a parity generation matrix, and may provide the memory module MM with the codeword set SCW including the user data set, the meta data, and the parity data set in a write operation of the memory system 20. The user data set may be stored in the data chips 200a~200k, the meta data and a first portion of the parity data set may be stored in the first parity chip 200pa, and a second portion of the parity data set may be stored in the second parity chip 200pb.

Alternatively or additionally, the ECC engine 130 may perform an ECC decoding on the codeword set SCW read from the memory module MM using a parity check matrix to generate a first syndrome and a second syndrome, and may correct correctable errors in a user data set of the codeword set SCW based on the first syndrome and the second syndrome.

Alternatively or additionally, the memory controller 100 may further include an error managing circuit (EMC) 400. The error managing circuit 400 may be a portion of, or may separate from, the ECC engine 130. The error managing circuit 400 may count error addresses associated with correctable errors detected in a plurality of read operations, may store second syndromes associated with the correctable errors by accumulating the second syndromes, may determine attribute of the correctable errors based on a result of the counting and the accumulation of the second syndromes, and may determine an error management policy on at least one memory region associated with the correctable errors, of the plurality of data chips.

The error managing circuit 400 may determine the error management policy based on a comparison of a number of the correctable errors with a reference value by referring to the accumulated second syndrome. For example, when a number of the errors by unit of symbol exceeds the reference value, which is obtained by accumulating the second syndromes, the error managing circuit 400 may prevent, or reduce the likelihood of, the correctable errors from being accumulated and may prevent, or reduce the likelihood of, occurrence of uncorrectable errors due to accumulation of the correctable errors by repairing the memory region.

Figure 2:
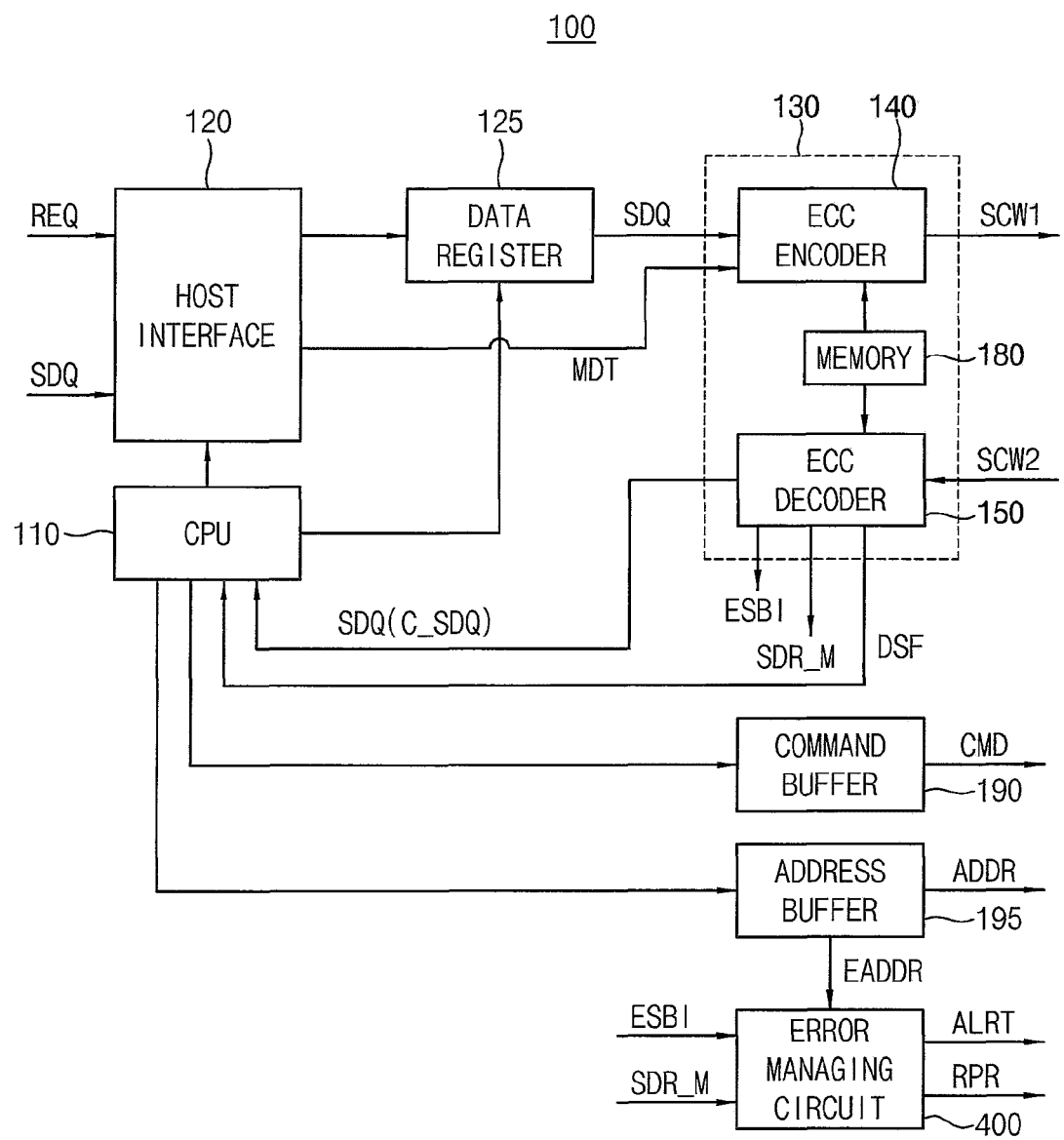
FIG. 2 is block diagram illustrating the memory controller in the memory system of FIG. 1 according to some example embodiments.

FIG. 2 is block diagram illustrating the memory controller in the memory system of FIG. 1 according to example embodiments.

Referring to FIG. 2, the memory controller 100 includes a central processing unit (CPU) 110, a host interface 120, a data register 125, the ECC engine 130, a command buffer 190, an address buffer 195 and the error managing circuit 400. The ECC engine 130 includes an ECC encoder 140, an ECC decoder 150 and a memory (an ECC memory) 180.

The host interface 120 receives a request REQ and a user data set SDT from the host, generates a meta data MDT associated with the user data set SDT, provides the user data set SDT to the data register 125, and provides the meta data MDT to the ECC encoder 140. The data register 125 continuously (and/or sequentially and/or serially) outputs the user data set SDT to the ECC engine 130.

The ECC encoder 140 may perform an ECC encoding on the user data set SDQ and the meta data MDT using a parity generation matrix to generate a first codeword set SCW1.

The ECC decoder 150 may perform an ECC decoding on a second codeword set SCW2 using the parity check matrix to output a decoding status flag DSF to the CPU 110 and to generate a first syndrome and a second syndrome. The ECC decoder 150 may correct the correctable errors in the user data set in the second codeword set SCW2 by units of symbols and may provide a corrected user data set C_SDQ (or, a user data set when the errors are not detected) to the CPU 110. The ECC decoder 150 may provide the error managing circuit 400 with a second syndrome SDR_M associated with the correctable errors and error symbol information associated with a symbol in which a correctable error occurs.

The memory 180 may store the parity generation matrix and the parity check matrix.

The CPU receives the user data set SDQ and/or the corrected user data set C_SDQ and controls the ECC engine 130, the command buffer 190, and/or the address buffer 195. The command buffer 190 stores the command CMD corresponding to the request REQ and transmits the command CMD to the memory module MM under control of the CPU 110.

The address buffer 195 stores the address ADDR and transmits the address ADDR to the memory module MM under control of the CPU 110. The address buffer 195 may provide the error managing circuit 400 with address associated with the correctable error as an error address EADDR.

The error managing circuit 400 may count error addresses EADDR provided from the address buffer 195 and associated with correctable errors detected in a plurality of read operations on the memory module MM, may store the second syndromes SDR_M associated with the correctable errors by accumulating the second syndromes SDR_M, may determine attribute of the correctable errors based on a result of the counting and the accumulation of the second syndromes, and may determine an error management policy on at least one memory region associated with the correctable errors. The error managing circuit 400 may provide the CPU 110 with an alert signal ALRT and a repair signal RPR based on the determined attribute. The alert signal ALRT may notify or be associated with a possibility of occurrence of uncorrectable errors and the repair signal RPR may be associated with repairing the memory region.

A symbol may correspond to a plurality of data bits in the user data set SDQ, read from one of a plurality of data chips. For example, a data unit read from one data chip, in the user data set SDQ may referred to as a symbol.

Figure 3:
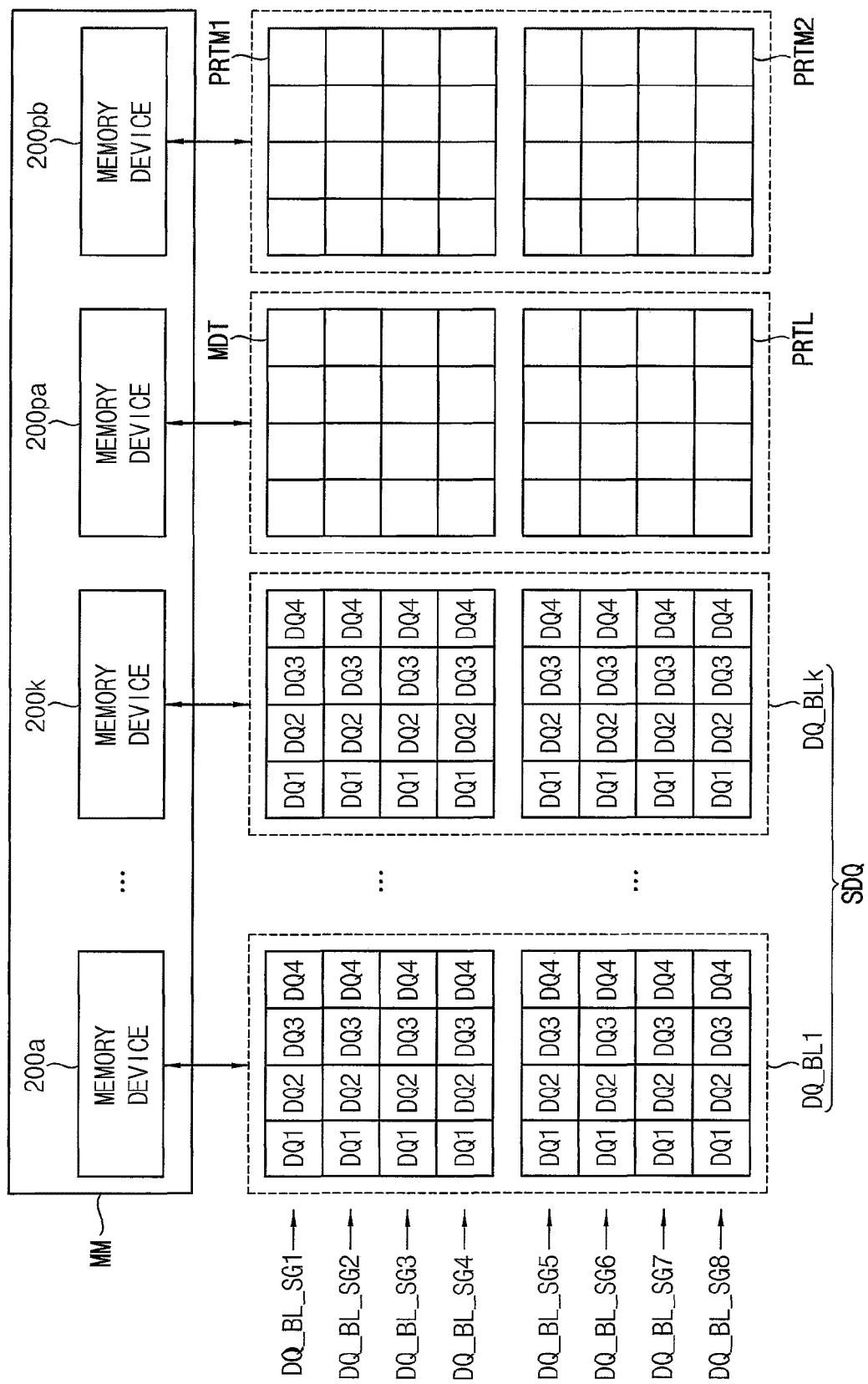
FIG. 3 illustrates data sets corresponding to the plurality of burst lengths in the memory system of FIG. 1, according to some example embodiments.

FIG. 3 illustrates data sets corresponding to the plurality of burst lengths in the memory system of FIG. 1, according to some example embodiments.

Referring to FIG. 3, each of the data chips 200a~200k and the parity chips 200pa and 200pb may perform a burst operation.

Herein, a burst operation refers to an operation of writing and/or reading a large amount of data by sequentially increasing and/or decreasing an initial address provided from the memory controller 100. A basic unit of the burst operation may be referred to a burst length BL.

Referring to FIG. 3, each of the data sets DQ_BL1~DQ_BLk corresponding to the plurality of burst lengths are input to/output from each of the data chips 200a~200k. Each of the data sets DQ_BL1~DQ_BLk may include data segments DQ_BL_SG11~DQ_BL_SG18 corresponding to each burst length of the plurality of burst lengths. The data sets DQ_BL1~DQ_BLk may correspond to the user data set SDQ. The burst length is assumed to be 8 in FIG. 3; however, example embodiments are not limited thereto.

While the burst operation is performed in each of the data chips 200a~200k, the meta data MDT and a first parity data PRTL corresponding to the plurality of burst lengths are input to/output from the first parity chip 200pa; and a first sub parity data PRTM1 and a second sub parity data PRTM2 corresponding to the plurality of burst lengths are input to/output from are input to/output from the second parity chip 200*pb*. A second parity data PRTM includes the first sub parity data PRTM1 and the second sub parity data PRTM2.

The first parity data PRTL may be referred to as an error locator parity data and may be associated with locations of error bits in the user data set SDQ/ The second parity data PRTM may be referred to as an error magnitude parity data and may be associated with magnitude (or, numbers or counts) of the error bits in the user data set SDQ.

Figure 4:
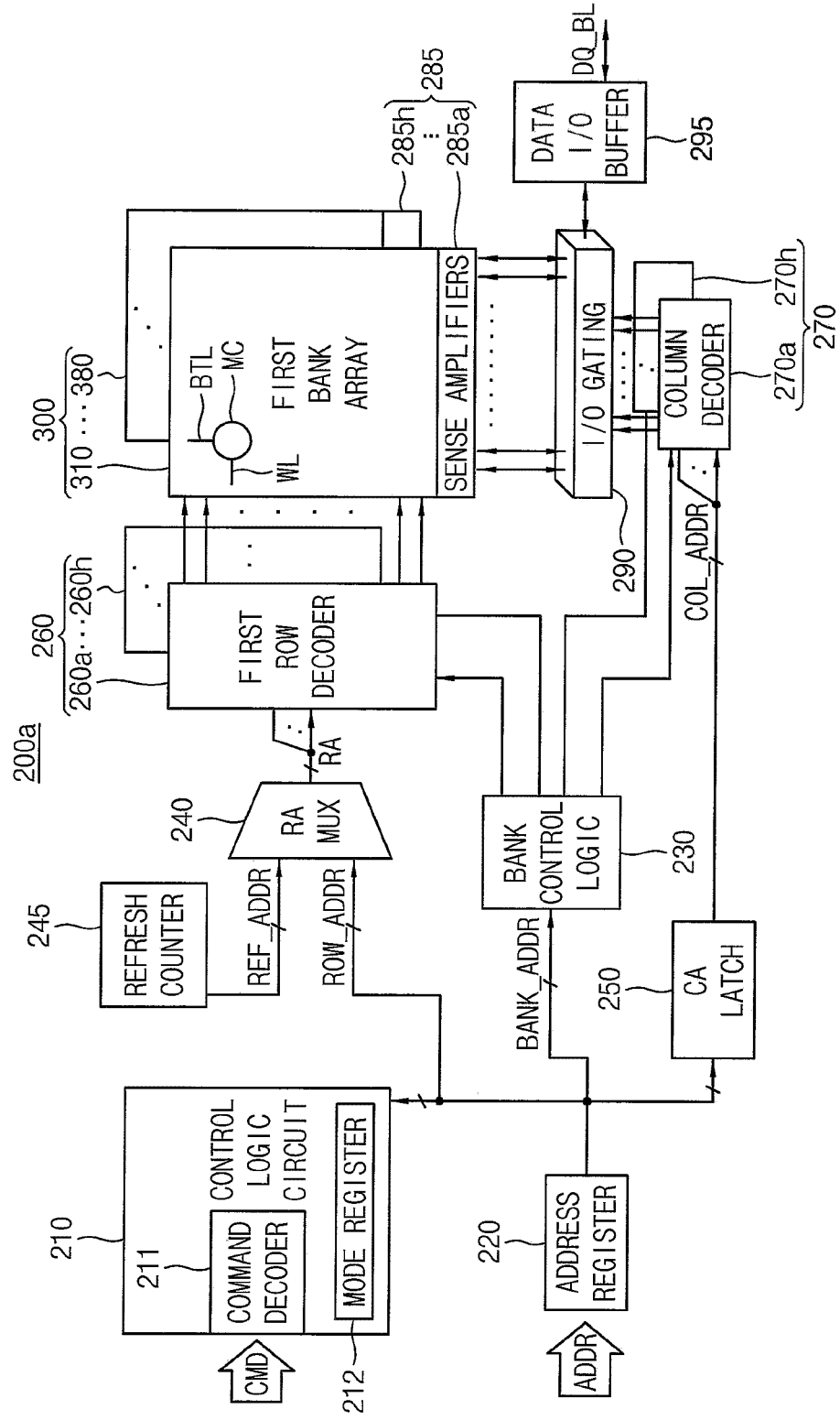
FIG. 4 is a block diagram illustrating one of the data chips in the memory module of FIG. 1 according to some example embodiments.

FIG. 4 is a block diagram illustrating one of the data chips in the memory module of FIG. 1 according to example embodiments.

Referring to FIG. 4, the data chip 200*a* may include a control logic circuit 210, an address register 220, a bank control logic circuit 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295 and/or a refresh counter 245. The data chip 200*a* may include a single number of, or a plurality of, each of the above.

The memory cell array 300 may include first through eighth bank arrays 310~380 (e.g., first through eighth bank arrays 310, 320, 330, 340, 350, 360, 370 and 380).

The row decoder 260 may include first through eighth bank row decoders 260*a*~260*h* coupled to the first through eighth bank arrays 310~380, respectively. The column decoder 270 may include first through eighth bank column decoders 270*a*~270*h* coupled to the first through eighth bank arrays 310~380, respectively. The sense amplifier unit 285 may include first through eighth bank sense amplifiers 285*a*~285*h* coupled to the first through eighth bank arrays 310~380, respectively.

The first through eighth bank arrays 310~380, the first through eighth bank row decoders 260*a*~260*h*, the first through eighth bank column decoders 270*a*~270*h*, and the first through eighth bank sense amplifiers 285*a*~285*h* may form first through eighth banks. Each of the first through eighth bank arrays 310~380 may include a plurality of word-lines WL, a plurality of bit-lines BL, and a plurality of memory cells MC formed at intersections of the word-lines WL and the bit-lines BL.

Although the data chip 200*a* is illustrated in FIG. 4 as including eight banks, the data chip 200*a* may include any number of banks; for example, one, two, four, eight, sixteen, or thirty two banks, or any number therebetween one and thirty two.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through eighth bank row decoders 260*a*~260*h* corresponding to the bank address BANK_ADDR may be activated in response to the bank control signals, and one of the first through eighth bank column decoders 270*a*~270*h* corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260*a*~260*h*.

The activated one of the first through eighth bank row decoders 260*a*~260*h* may decode the row address RA that is output from the row address multiplexer 240, and may activate a word-line WL corresponding to the row address RA. For example, the activated bank row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270*a*~270*h*.

The activated one of the first through eighth bank column decoders 270*a*~270*h* may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and may also include write control devices for writing data to the first through eighth bank arrays 310~380.

Data to be read from one of the first through eighth bank arrays 310~380 may be sensed by a sense amplifier coupled to the one bank array from which the data is to be read, and may be stored in the read data latches.

The data stored in the read data latches may be provided to the memory controller 100 via the data I/O buffer 295 after the ECC engine 130 performs an ECC decoding on the data (e.g., a codeword CW). Data set DQ_BL to be written in one of the first through eighth bank arrays 310~380 may be provided to the data I/O buffer 295 from the memory controller 100. The data I/O buffer 295 may provide the data set DQ_BL to the I/O gating circuit 290.

The control logic circuit 210 may control operations of the data chip 200*a*. For example, the control logic circuit 210 may generate control signals for the data chip 200*a* to perform the write operation and/or the read operation. The control logic circuit 210 may include a command decoder 211 that decodes the command CMD received from the memory controller 100 and a mode register 212 that sets an operation mode of the data chip 200*a*. According to some example embodiments, operations described herein as being performed by the control logic circuit 210 may be performed by processing circuitry.

Each of the parity chips 200*pa* and 200*pb* may have the same or substantially the same configuration as the data chip 200*a*. Each of the parity chips 200*pa* and 200*pb* may input/output a corresponding parity data.

Figure 5:
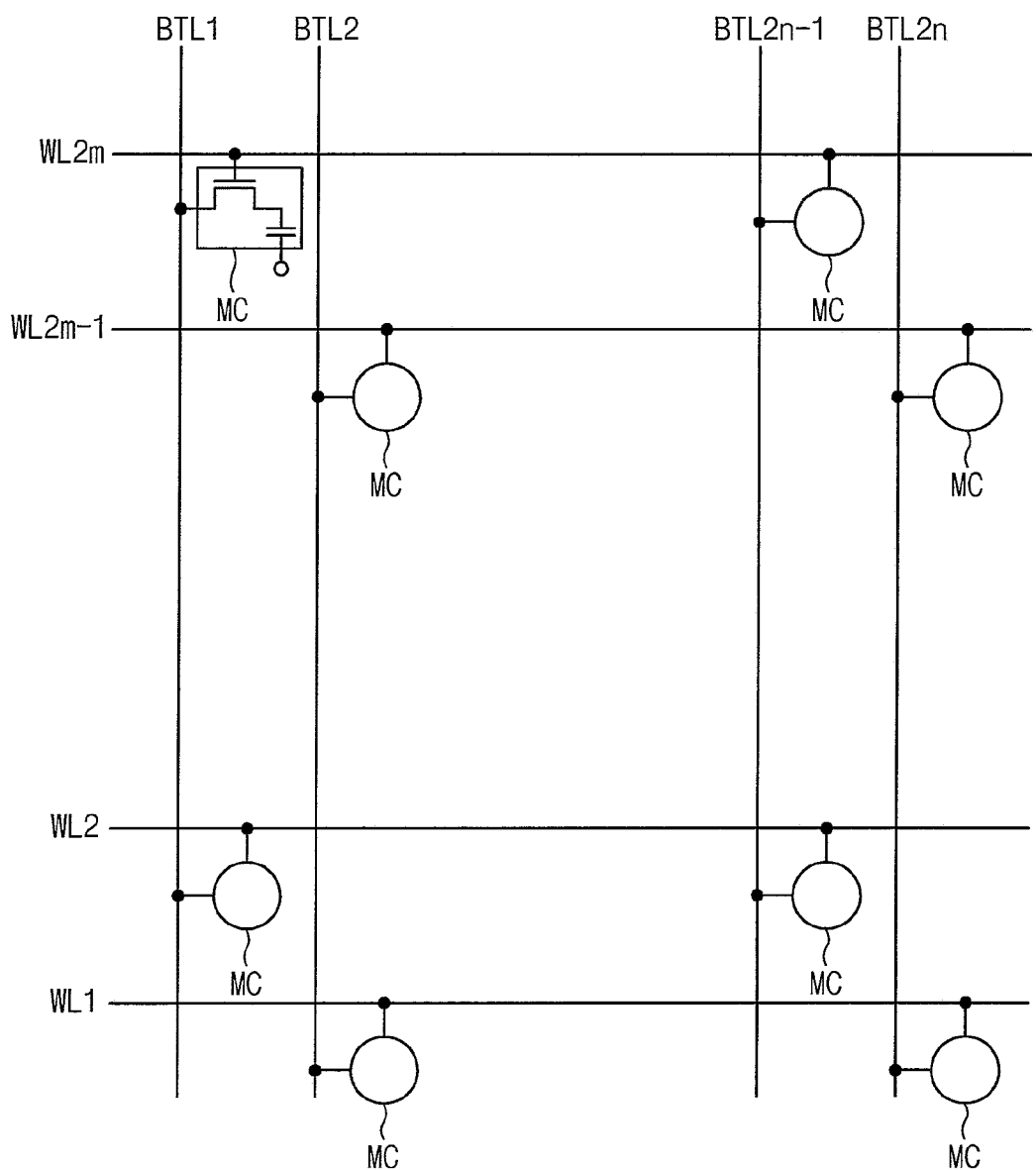
FIG. 5 illustrates a first bank array of the data chip of FIG. 4 according to some example embodiments.

FIG. 5 illustrates a first bank array of the data chip of FIG. 4 according to example embodiments.

Referring to FIG. 5, the first bank array 310 includes a plurality of word-lines WL1~WL2*m* (where m is a natural number greater than or equal to two), a plurality of bit-lines BTL1~BTL2n (where n is a natural number greater than or equal to two that may or may not be the same as m), and a plurality of memory cells MCs disposed at or near intersections between the word-lines WL1~WL2m and the bit-lines BTL1~BTL2n. In some example embodiments, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

Figure 6:
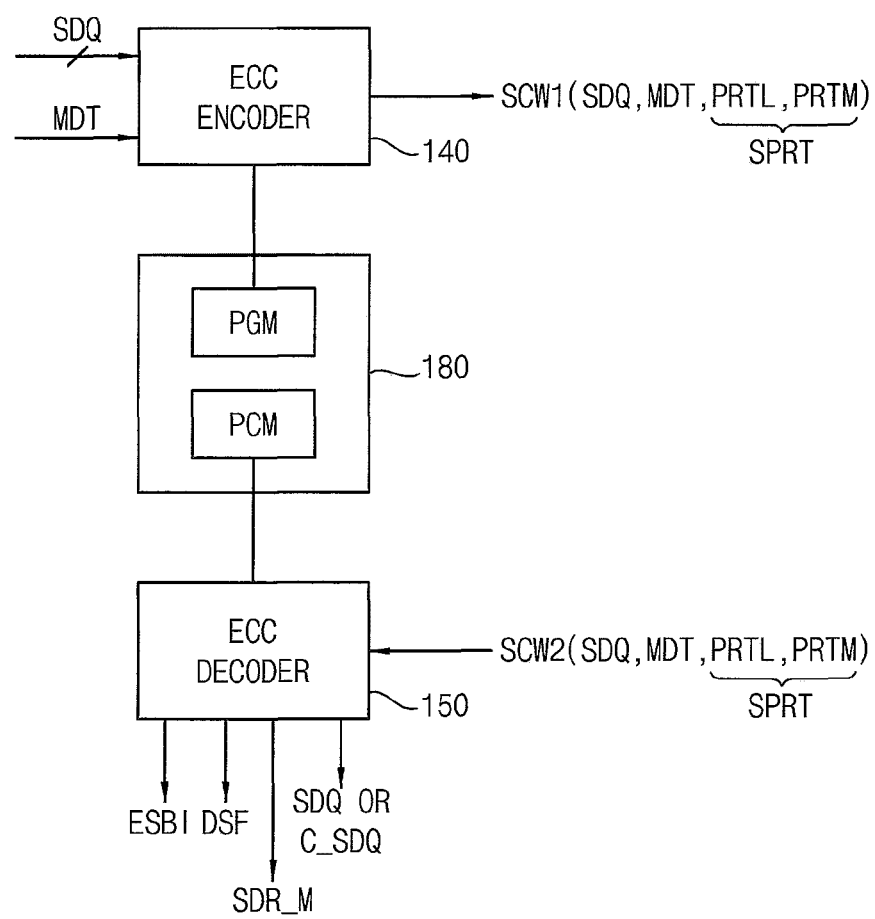
FIG. 6 is a block diagram illustrating an example of the ECC engine in FIG. 2 according to some example embodiments.

FIG. 6 is a block diagram illustrating an example of the ECC engine in FIG. 2 according to some example embodiments.

Referring to FIG. 6, the ECC engine 130 includes the ECC encoder 140, the ECC decoder 150, and the memory 180. The memory 180 may be referred to as an ECC memory. Although the ECC encoder 140 and the CC decoder 150 are illustrated as separate components, example embodiments are not limited thereto.

The memory 180 is connected to the ECC encoder 140 and the ECC decoder 150 and may store a parity generation matrix PGM and a parity check matrix PCM.

The ECC encoder 140 may perform an ECC encoding on the user data set SDQ and the meta data MBT by using the parity generation matrix PCM to generate a parity data set SPRT including the first parity data PRTL and the second parity data PRTM, and may output the first codeword set SCW1 including the user data set SDQ, the meta data MBT and the parity data set SPRT.

The ECC decoder 150 may receive, from the memory module MM, a second codeword set SCW2 including the user data set SDQ, the meta data MBT, and the parity data set SPRT The ECC decoder 150 is connected to the register 185 and receives the error information signals EIS. The ECC decoder 150 may perform an ECC decoding on the second codeword set SCW2 by using the parity check matrix PCM to generate the first syndrome and the second syndrome, may correct the correctable errors in the user data set in the second codeword set SCW2 by units of symbols based on the first syndrome and the second syndrome, and may output the decoding status flag DSF indicating that the correctable errors are correcting while outputting the corrected user data set C_SDQ (or, a user data set when the errors are not detected). The ECC decoder 150 may provide the second syndrome SDR_M associated with the correctable errors and the error symbol information ESBI to the error managing circuit 400 in FIG. 2.

The ECC decoder 150 may perform the ECC decoding to generate the first syndrome and the second syndrome, may correct multiple error bits in the user data set SDQ which are uncorrectable based on the first syndrome and the second syndrome by using the error information signals EIS and the second syndrome, and may output the corrected user data set C_SDQ.

Figure 7:
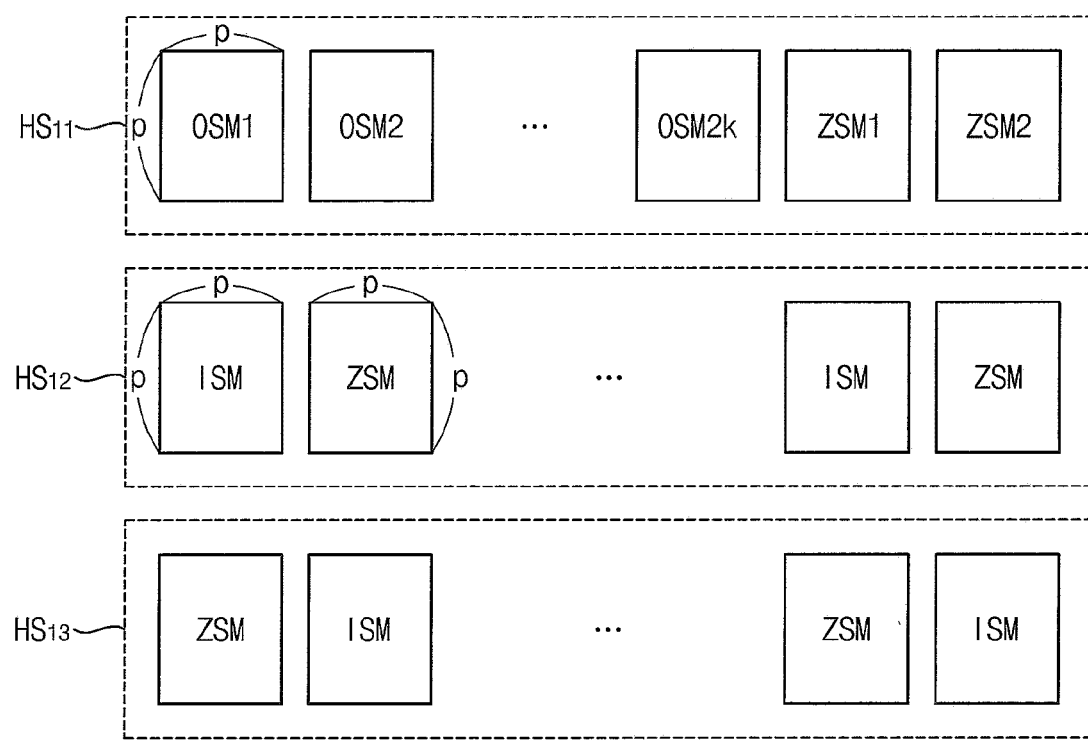
FIG. 7 illustrates a parity generation matrix stored in the memory in the ECC engine of FIG. 6.

FIG. 7 illustrates a parity generation matrix stored in the memory in the ECC engine of FIG. 6.

Referring to FIG. 7, the parity generation matrix PGM may include a first parity sub matrix $HS_{11}$, a second parity sub matrix $HS_{12}$, and a third parity sub matrix $HS_{13}$.

The first parity sub matrix $HS_{11}$ includes a plurality of offset sub matrixes OSM1~OSM2k corresponding to the data chips 200a~200k, along with two zero sub matrixes ZSM1 and ZSM2 corresponding to the parity chips 200pa and 200pb. Each of the offset sub matrixes OSM1~OSM2k and the zero sub matrixes ZSM1 and ZSM2 includes p×p elements (where p is a natural number greater than one).

The second parity sub matrix $HS_{12}$ includes a plurality of (k+1) unit sub matrixes ISMs and a plurality of (k+1) zero sub matrixes ZSMs. Each of the (k+1) unit sub matrixes ISMs, and the (k+1) zero sub matrixes ZSMs includes p×p elements. In addition, the (k+1) unit sub matrixes ISMs and the (k+1) zero sub matrixes ZSMs are alternatingly arranged.

The third parity sub matrix $HS_{13}$ includes a plurality of (k+1) zero sub matrixes ZSMs and a plurality of (k+1) unit sub matrixes ISMs. Each of the (k+1) zero sub matrixes ZSMs and the (k+1) unit sub matrixes ISMs includes p×p elements. In addition, the (k+1) zero sub matrixes ZSMs and the (k+1) unit sub matrixes ISMs are alternatingly arranged.

Figures 8, 9:
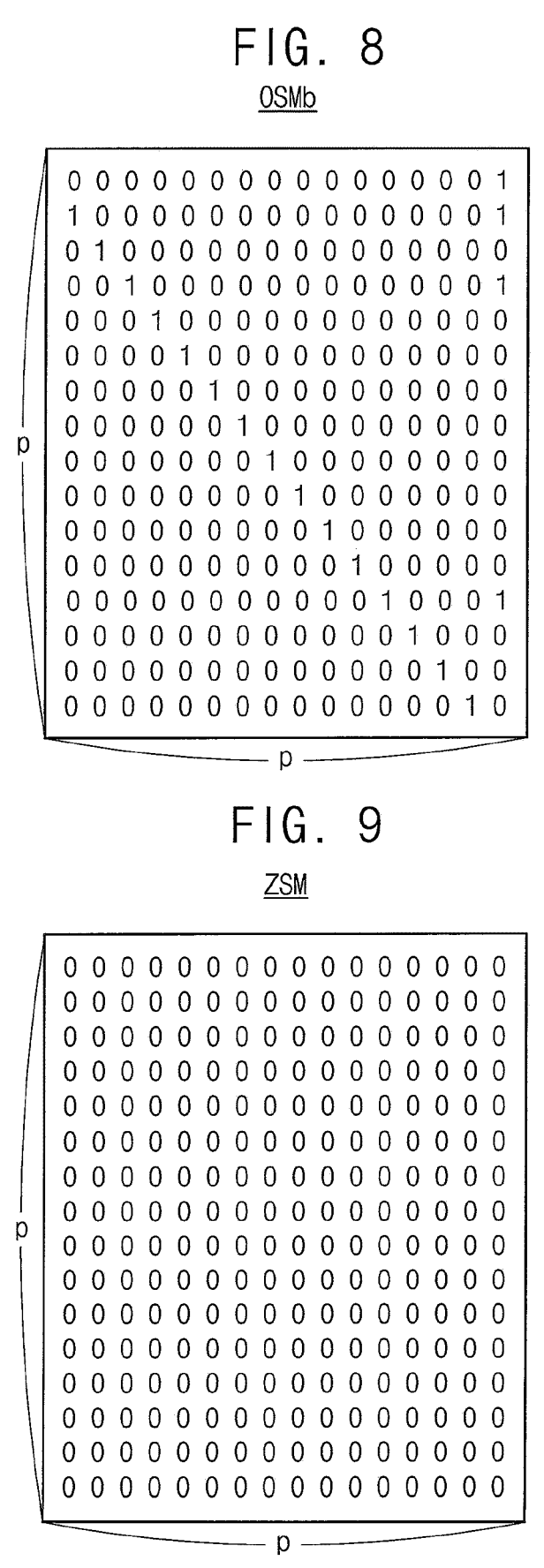

FIG. 8 illustrates an example of a base offset sub matrix which is used for generating the offset sub matrixes in the first parity sub matrix.

Referring to FIG. 8, a base offset sub matrix OSMb may include (p+3) high level elements (represented with a "1" in FIG. 8). The base offset sub matrix OSMb may be obtained based on a primitive polynomial such as $x^{16}+x^{12}+x^3+x+1$. If a p-th order primitive polynomial is varied, elements of each of the offset sub matrixes OSM1~OSM2k may be varied.

The offset sub matrix OSM1 of the offset sub matrixes OSM1~OSM2k may be obtained by powers of the base offset sub matrix OSMb. The offset sub matrix OSM2 of the offset sub matrixes OSM1~OSM2k may be obtained by multiplying the offset sub matrix OSM1 and a sub matrix obtained by powers of the base offset sub matrix OSMb by an offset.

In addition, a gap between two offset sub matrixes OSM(2i-1) and OSM(2i) associated with one (memory) chip of the offset sub matrixes OSM1~OSM2k may be regular. Here, i is one of one through eight. For example, the offset sub matrix OSM4 may be obtained by multiplying the offset sub matrix OSM3 and a sub matrix obtained by powers of the base offset sub matrix OSMb by an offset.

FIG. 9 illustrates an example of a zero sub matrix in the parity generation matrix in FIG. 7.

Referring to FIG. 9, in a zero sub matrix ZSM corresponding to each of the zero sub matrixes ZSMs, each of elements has a zero.

FIG. 10 illustrates an example of a unit (or identity) sub matrix in the parity generation matrix in FIG. 7.

Referring to FIG. 10, a unit sub matrix ISM corresponding to each of the unit sub matrixes ISMs includes p high level elements disposed in a diagonal direction. Each of other elements except the high level elements has a zero.

In FIGS. 7 through 10, p may correspond to 16 and may correspond to a number of bits of the data set DQ_BL which are input to/output from each of the data chips 200a~200k during one burst operation. In addition, a number of non-zero elements in the first parity sub matrix $HS_{11}$ may be greater than a number of non-zero elements in the second parity sub matrix $HS_{12}$ or a number of non-zero elements in the third parity sub matrix $HS_{13}$.

Figure 11:
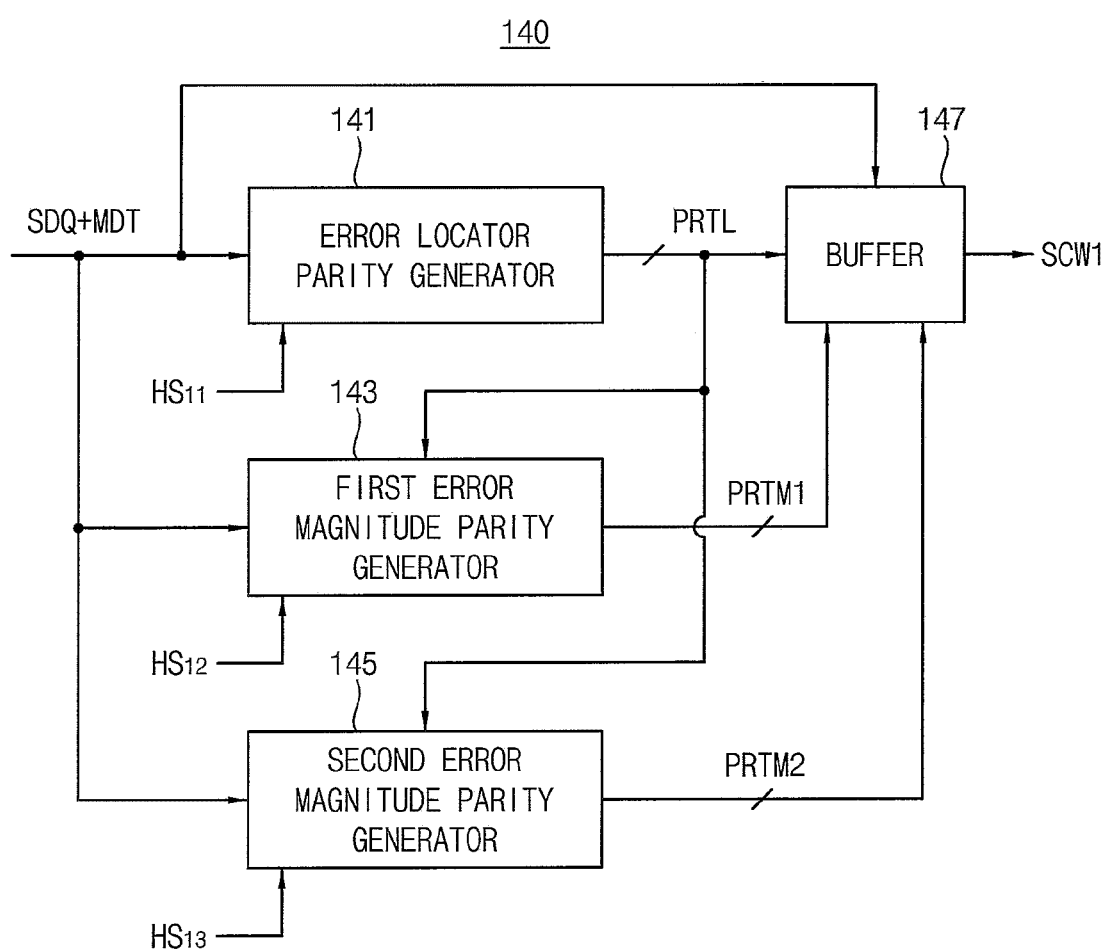
FIG. 11 illustrates an example of the ECC encoder in the ECC engine of FIG. 6 according to some example embodiments.

FIG. 11 illustrates an example of the ECC encoder in the ECC engine of FIG. 6 according to some example embodiments.

Referring to FIG. 11, the ECC encoder 140 includes an error locator parity generator 141, a first error magnitude parity generator 143, a second error magnitude parity generator 145, and a buffer 147.

The error locator parity generator 141 performs an ECC encoding on the user data set SDQ and the meta data MDT by using the first parity sub matrix $HS_{11}$ to generate the first parity data PRTL, which is used for determining locations of errors and which provides the first parity data PRTL to the buffer 147. The first parity data PRTL may be referred to as a first parity data.

The error locator parity generator 141 may generate the first parity data PRTL by performing a matrix-multiplication operation on the user data set SDQ and the meta data MDT with the first parity sub matrix $HS_{11}$. If a vector representation of the user data set SDQ and the meta data MDT corresponds to ms and a vector representation of the error locator parity data PRTL corresponds to $p_L$, $p_L = HS_{11}[ms\ 0]^T$. Here, T represents a transposed matrix and 0 represents a zero matrix.

The first error magnitude parity generator 143 may perform an ECC encoding on the user data set SDQ and the meta data MDT by using the second parity sub matrix $HS_{12}$ to generate the first sub parity data PRTM1 which is used for determining a number of bit errors and provides the first error magnitude parity data PRTM1 to the buffer 147. The first sub parity data PRTM1 may be referred to as a first error magnitude parity data.

The first error magnitude parity generator 143 may generate the first sub parity data PRTM1 by performing a matrix-multiplication operation on the user data set SDQ and the meta data MDT with the second parity sub matrix $HS_{12}$. If a vector representation of the first sub parity data PRTM1 corresponds to $p_{M1}$, $p_{M1} = HS_{121}[ms\ p_L\ 0]^T$.

The second error magnitude parity generator 145 performs an ECC encoding on the user data set SDQ and the meta data MDT by using the third parity sub matrix $HS_{13}$ to generate the second sub parity data PRTM2 which is used for determining a number of bit errors and provides the second error magnitude parity data PRTM2 to the buffer 147. The second sub parity data PRTM2 may be referred to as a second error magnitude parity data.

The second error magnitude parity generator 145 may generate the second sub parity data PRTM2 by performing a matrix-multiplication operation on the user data set SDQ and the meta data MDT with the third parity sub matrix $HS_{13}$. If a vector representation of the second error magnitude parity data PRTM2 corresponds to $p_{M2}$, $p_{M2} = HS_{13}[ms\ p_L\ 0]^T$. The first sub parity data PRTM1 and the second sub parity data PRTM2 may be included in the second parity data PRTM.

The buffer 147 receives the user data set SDQ, the meta data MDT, the first parity data PRTL, the first sub parity data PRTM1, and the second sub parity data PRTM2 and provides the memory module MM with the codeword set SCW1 including the user data set SDQ, the meta data MDT, the first parity data PRTL, the first sub parity data PRTM1 and the second sub parity data PRTM2.

Figure 12:
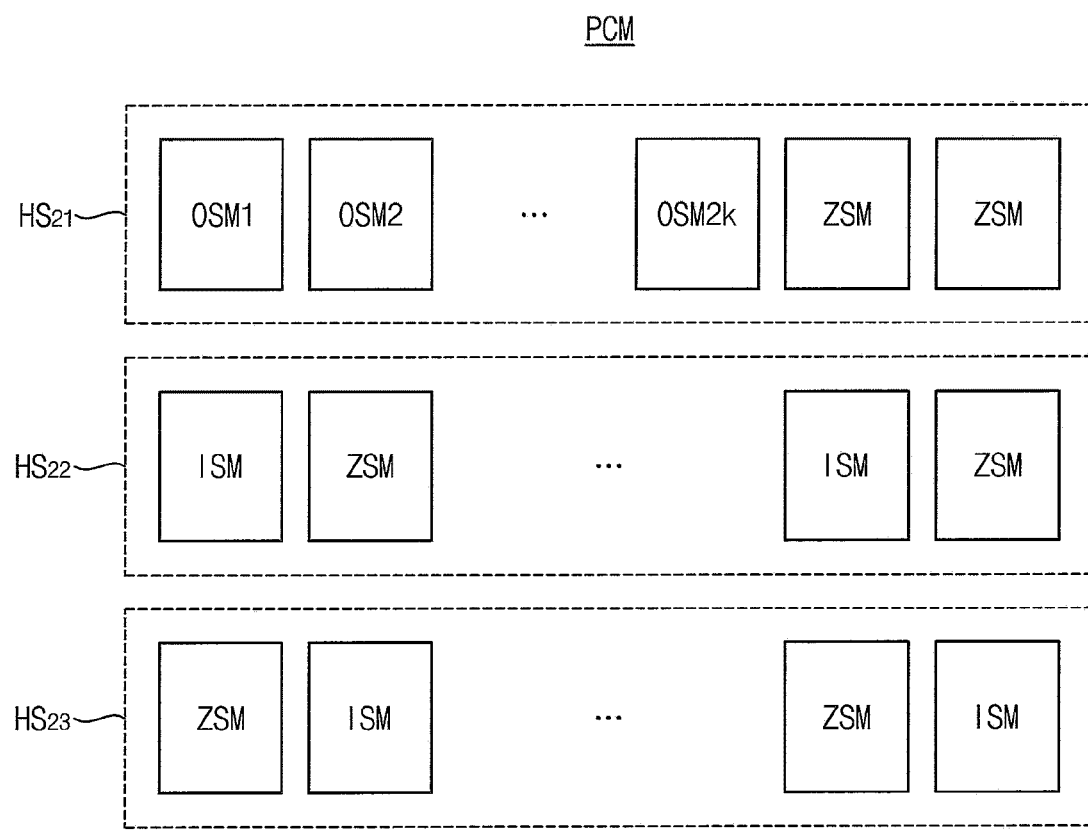
FIG. 12 illustrates an example of a parity check matrix stored in the memory in the ECC engine of FIG. 6.

FIG. 12 illustrates an example of a parity check matrix stored in the memory in the ECC engine of FIG. 6.

Referring to FIG. 12, the parity check matrix PCM includes a first parity sub matrix $HS_{21}$, a second parity sub matrix $HS_{22}$ and a third parity sub matrix $HS_{23}$.

The first parity sub matrix $HS_{21}$ includes a plurality of offset sub matrixes OSM1~OSM2k corresponding to the data chips 200a~200k and two zero sub matrixes ZSM1 and ZSM2 corresponding to the parity chips 200pa and 200pb. Each of the offset sub matrixes OSM1~OSM2k and the zero sub matrixes ZSM1 and ZSM2 includes p×p elements.

The second parity sub matrix $HS_{22}$ includes a plurality of (k+1) unit sub matrixes ISMs and a plurality of (k+1) zero sub matrixes ZSMs. Each of the (k+1) unit sub matrixes ISMs and the (k+1) zero sub matrixes ZSMs includes p×p elements. In addition, the (k+1) unit sub matrixes ISMs and the (k+1) zero sub matrixes ZSMs are alternatingly arranged.

The third parity sub matrix $HS_{23}$ includes a plurality of (k+1) zero sub matrixes ZSMs and a plurality of (k+1) unit sub matrixes ISMs. Each of the (k+1) zero sub matrixes ZSMs and the (k+1) unit sub matrixes ISMs includes p×p elements. In addition, the (k+1) zero sub matrixes ZSMs and the (k+1) unit (identity) sub matrixes ISMs are alternatingly arranged.

Referring to FIGS. 7 and 12, the first parity sub matrix $HS_{21}$ is the same as the first parity sub matrix $HS_{11}$ and the second parity sub matrix $HS_{22}$ is the same as the second parity sub matrix $HS_{12}$. The third parity sub matrix $HS_{23}$ is the same as the third sub matrix $HS_{13}$. In addition, the ECC encoder 141 and the ECC decoder 150 in FIG. 6 share the parity generation matrix PGM and perform ECC encoding and ECC decoding, respectively. The parity generation matrix PGM may be equivalent to the parity check matrix PCM in FIG. 6.

Figure 13:
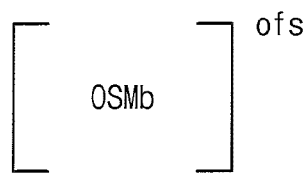
FIG. 13 illustrates an example of an offset sub matrix in FIG. 12.

FIG. 13 illustrates an example of an offset sub matrix in FIG. 12.

Referring to FIG. 3, the offset sub matrix OSM may be obtained by powers of the base offset sub matrix OSMb by an offset ofs.

Referring to FIGS. 12 and 13, a number of non-zero elements in the first parity sub matrix $HS_{21}$ may be greater than a number of non-zero elements in the second parity sub matrix $HS_{22}$ or a number of non-zero elements in the third parity sub matrix $HS_{23}$. Therefore, the ECC decoder 150 in FIG. 6 generates a first sub syndrome and a second sub syndrome by using the second parity sub matrix $HS_{22}$ and the third parity sub matrix $HS_{23}$, and may generate the second syndrome by summing the first sub syndrome and the second sub syndrome.

Figure 14:
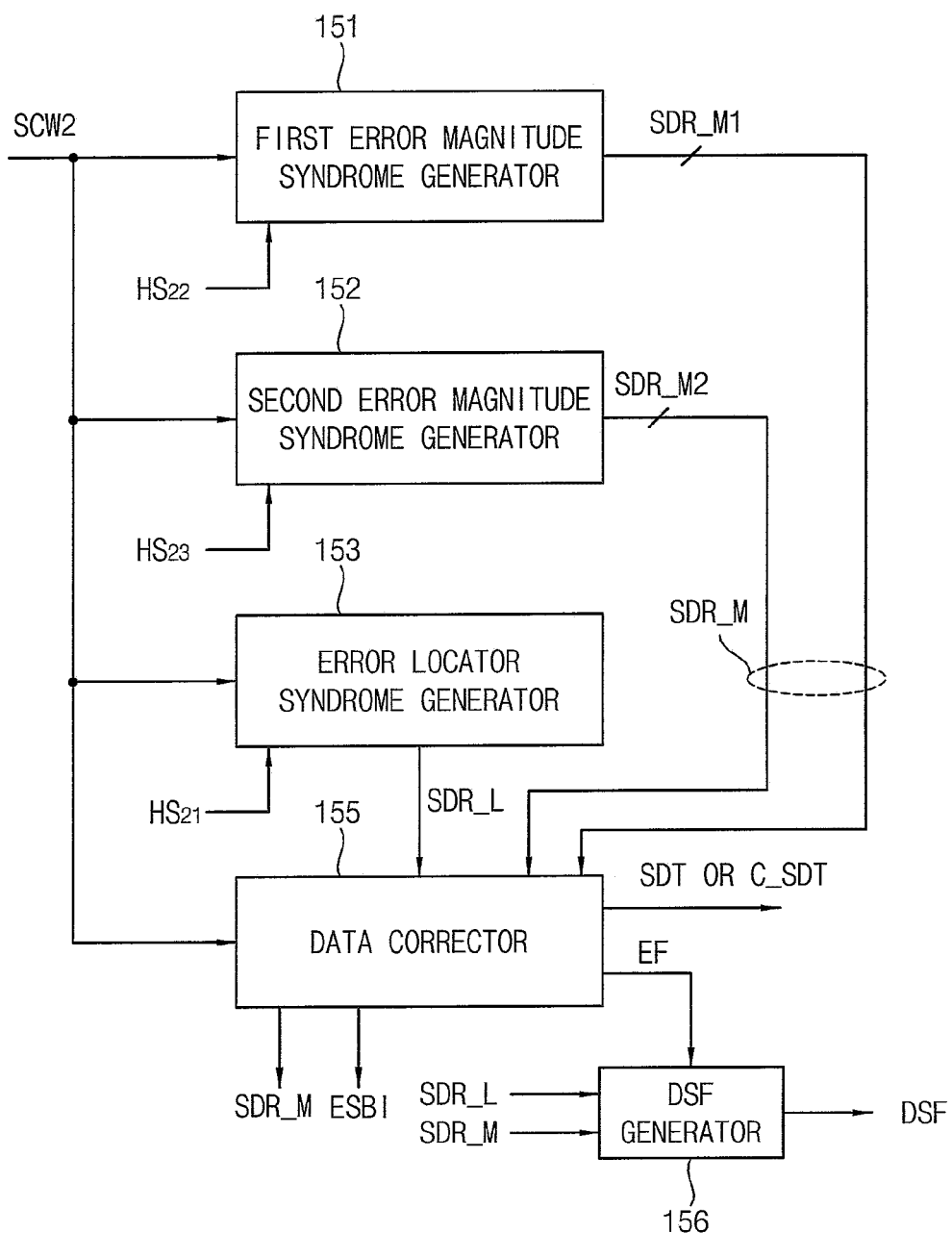
FIG. 14 illustrates an example of the ECC decoder in the ECC engine of FIG. 6 according to some example embodiments.

FIG. 14 illustrates an example of the ECC decoder in the ECC engine of FIG. 6 according to some example embodiments.

Referring to FIG. 14, the ECC decoder 150 includes a first error magnitude syndrome generator 151, a second error magnitude syndrome generator 152, an error locator syndrome generator 153, a data corrector 155, and a decoding status flag generator 156.

The first error magnitude syndrome generator 151 generates a first sub syndrome SDR_M1 indicating a number of error bits by performing a matrix-multiplication operation on the read codeword set SCW2 and the second parity sub matrix $HS_{22}$. If a vector representation of the read codeword set SCW2 corresponds to $r^T$ and a vector representation of the first sub syndrome SDR_M1 corresponds to $S_{M01}$, $S_{M01} = HS_{22}r^T$.

The second error magnitude syndrome generator 152 generates a second sub syndrome SDR_M2 indicating a number of error bits by performing a matrix-multiplication operation on the read codeword set SCW2 and the third parity sub matrix $HS_{23}$. If a vector representation of the second sub syndrome SDR_M2 corresponds to $S_{M02}$, $S_{M02} = HS_{23}r^T$. The first sub syndrome SDR_M1 and the second sub syndrome SDR_M2 are included in a second syndrome SDR_M, i.e., an error magnitude syndrome.

The error locator syndrome generator 153 generates a first syndrome SDR_L indicating positions of correctable errors in the read codeword set SCW2 and provides the first syndrome SDR_L to the data corrector 155. If a vector representation of the first syndrome SDR_L corresponds to $S_L$, $S_L = HS_{21}r^T$.

The data corrector 155 may correct correctable error bits in the user data set SDQ of the read codeword set SCW2 by unit of symbol based on the first syndrome SDR_L and the second syndrome SDR_M to output the corrected user data set C_SDQ or the user data set SDQ when the user data set SDQ includes uncorrectable errors. In addition, the data corrector 155 may output an error flag EF indicating whether the errors are corrected to the decoding status flag generator 156.

The data corrector 155 may provide the error managing circuit 400 in FIG. 2 with the second syndrome SDR_M and the error symbol information ESBI associated with the correctable errors when first syndrome SDR_L and the second syndrome SDR_M indicates that the user data set in the codeword set SCW2 includes the correctable errors.

The decoding status flag generator 156 may generate the decoding status flag DSF indicating whether the user data set in the codeword CW2 includes the correctable errors or uncorrectable errors based on the first second syndrome SDR_L, the second syndrome SDR_M and the error flag EF.

The first syndrome SDR_L having zero value and the second syndrome SDR_M having zero value indicate that the user data set in the codeword CW2 includes no errors. The first syndrome SDR_L having non-zero value and the second syndrome SDR_M having non-zero value indicate that the user data set in the codeword CW2 includes correctable error by unit of symbol.

The first syndrome SDR_L having zero value and the second syndrome SDR_M having non-zero value indicate that the user data set in the codeword CW2 includes uncorrectable errors which cannot be corrected using the first syndrome SDR_L and the second syndrome SDR_M.

When the user data set in the codeword CW2 includes correctable error by unit of symbol, detected through a plurality of read operations, the error managing circuit 400 may count error addresses associated with the correctable errors, may store the second syndromes associated with the correctable errors by accumulating the second syndromes, may determine attribute of the correctable errors based on a result of the counting and the accumulation of the second syndromes, and may determine an error management policy on the memory region in which the correctable errors occur.

Figure 15:
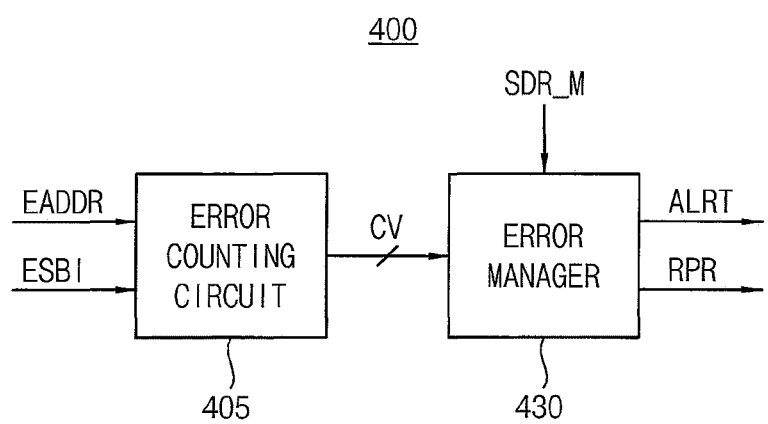
FIG. 15 is a block diagram illustrating an example of an error managing circuit in the memory controller of FIG. 2 according to some example embodiments.

FIG. 15 is a block diagram illustrating an example of an error managing circuit in the memory controller of FIG. 2 according to example embodiments.

Referring to FIG. 15, the error managing circuit 400 may include an error counting circuit 405 and an error manager 430.

The error counting circuit 405 may count the error addresses EADDR based on the error symbol information ESBI indicating a symbol in which the correctable errors occur to output a counting value CV.

The error manager 430 may receive the counting value CV and the second syndrome SDR_M. The error manager 430 may determine a first attribute (attribute about physical location in which the correctable errors occur) of the correctable errors based on the counting value CV, may generate a repair signal RPR for repairing the at least one memory region based on the first attribute and the accumulation of the second syndromes, and may predict occurrence of uncorrectable error in the at least one memory region based on the accumulation of the second syndromes to provide the CPU 110 with an alert signal ALRT associated with the prediction The error manager 430 may provide the alter repair signal RPR to the CPU 110 and the CPU 110 may provide the MM with aa address to be repaired and a command designating a repair operation.

Figure 16:
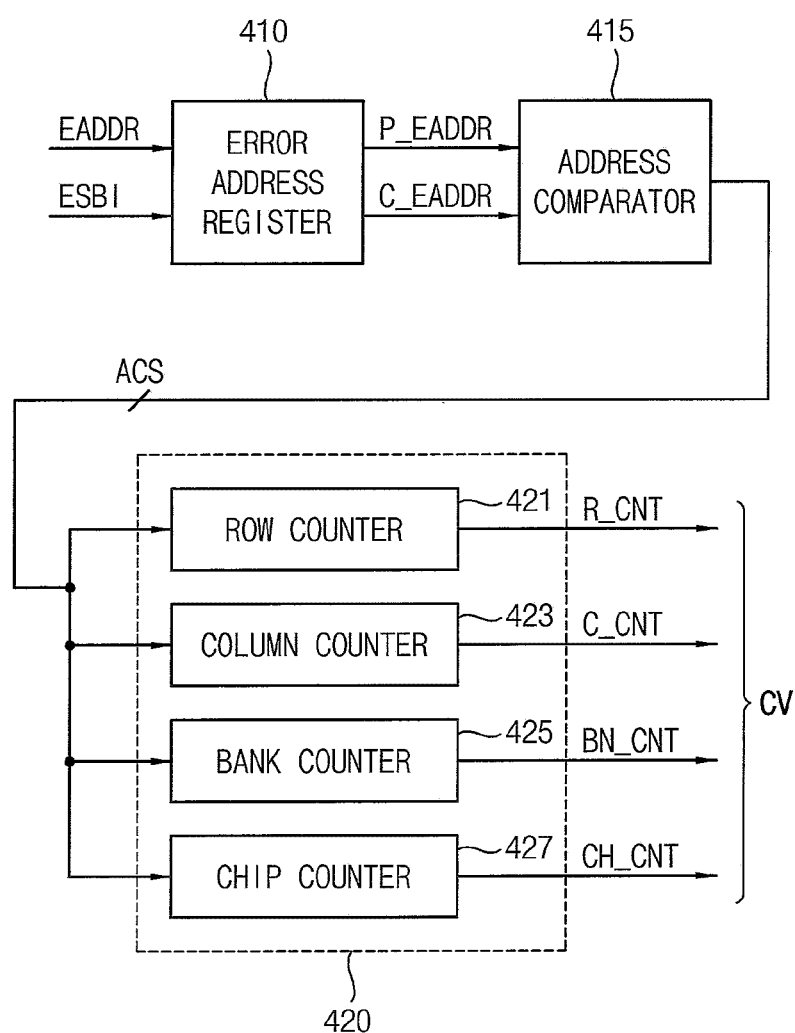
FIG. 16 is a block diagram illustrating an example of an error counting circuit in the error managing circuit of FIG. 15 according to some example embodiments.

FIG. 16 is a block diagram illustrating an example of an error counting circuit in the error managing circuit of FIG. 15 according to example embodiments.

Referring to FIG. 16, the error counting circuit 405 may include an error address register 410, an address comparator 415 and a counter circuit 420.

The error address register 410 may store the error addresses EADDR and the error symbol information ESBI. The address comparator 415, connected to the error address register 410, may compare a previous error address P_EADDR including error symbol information associated with a previous read operation among the read operations and a current error address C_EADDR including error symbol information associated with a current read operation to output an address comparison signal ACS indicating a result of the comparison.

The counter circuit 420 may receive the address comparison signal ACS to output the counting value CV based on a plurality of bits in the address comparison signal ACS. The counter circuit 420 may include a first counter (a row counter) 421, a second counter (a column counter) 423, a third counter (a bank counter) 425 and a fourth counter (a chip counter) 427.

The first counter 421 may output a first sub counting value R_CNT associated with a row address of the memory region based on the address comparison signal ACS. The second counter 423 may output a second sub counting value C_CNT associated with a column address of the memory region based on the address comparison signal ACS. The third counter 425 may output a third sub counting value BN_CNT associated with a bank address of the memory region based on the address comparison signal ACS. The fourth counter 427 may output a fourth sub counting value CH_CNT associated with a memory chip including the memory region based on the address comparison signal ACS.

The counting value CV may include the first sub counting value R_CNT, the second sub counting value C_CNT, the third sub counting value BN_CNT and the fourth sub counting value CH_CNT. The error manager 430 may determine physical attribute of the memory region based on a change of each of the first sub counting value R_CNT, the second sub counting value C_CNT, the third sub counting value BN_CNT and the fourth sub counting value CH_CNT.

FIG. 17 illustrates an example of the counting value in FIG. 16 according to example embodiments.

In FIG. 17, it is assumed that two correctable errors are detected in the user data set SDQ through two read operations performed on the codeword set SCW in FIG. 3, row addresses are different in the error address EADDR associated with the two correctable errors.

Referring to FIG. 17, when the row addresses are different in the error address EADDR associated with the two correctable errors, the first sub counting value R_CNT is incremented by 'one', FIG. 18 illustrates an example of the error address register in FIG. 16 according to example embodiments.

Referring to FIG. 18, the error address register 410 may be configured as a form of table.

Indexes Idx11 and Idx12 may store error address information EAI associated with the correctable errors and the error symbol information ESBI.

The error address register 410 may include a first column 411 and a second column 413, the first column 411 may store bank address/row address/column addresses BA/RA/CA_11 and BA/RA/CA_11 of the memory region in which the correctable errors occur as the error address information EAI and the second column 413 may store chip identifier CID1 of a data chip including the memory region in which the correctable errors occur as the error symbol information ESBI.

Figure 19:
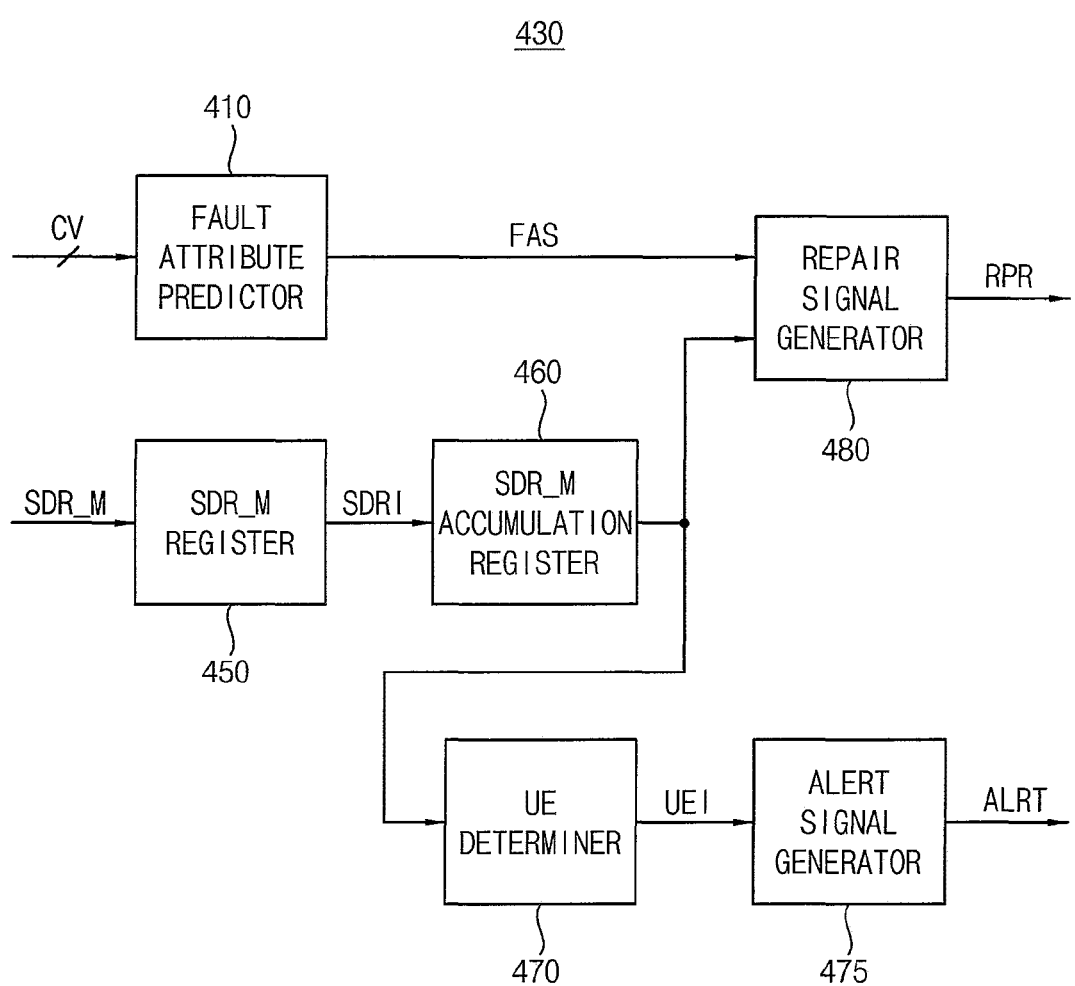
FIG. 19 is a block diagram illustrating an example of an error manger in the error managing circuit of FIG. 15 according to some example embodiments.

The error address information EAI and the error symbol information ESBI stored in the first index Idx11 may be provided to the address comparator 415 as the previous error address P_EADDR and the error address information EAI and the error symbol information ESBI stored in the second index Idx12 may be provided to the address comparator 415 as the current error address C_EADDR, FIG. 19 is a block diagram illustrating an example of an error manger in the error managing circuit of FIG. 15 according to example embodiments.

Referring to FIG. 19, the error manager 430 may include a fault attribute predictor 440, a syndrome register 450, a syndrome accumulation register 460, an uncorrectable error (UE) determiner 470, an alert signal generator 475 and a repair signal generator 480.

The fault attribute predictor 440 may determine the first attribute of the correctable errors based on the counting value CV to generate a fault attribute signal FAS indicating the first attribute. The syndrome register 450 may store the second syndrome SDR_M associated with the correctable error, obtained through one read operation.

The syndrome accumulation register 460, connected to the syndrome register 450, may store the second syndromes associated with the correctable errors, obtained through the plurality of read operations, by accumulating the second syndromes as syndrome information SDRI. The UE determiner 470, connected to the syndrome accumulation register 460, may generate uncorrectable error information UEI predicting occurrence of the uncorrectable error based on the accumulated second syndromes to provide the uncorrectable error information UEI to the alert signal generator 475. The UE determiner 470 may refer to the accumulated second syndromes, may compare a number of the correctable errors with a reference value and may provide the uncorrectable error information UEI to the alert signal generator 475 when the number of the correctable errors exceeds the reference value.

The alert signal generator 175 may provide the alert signal ALRT to the CPU 110 based on the uncorrectable error information UEI indicating that uncorrectable error may occur in the memory region. The repair signal generator 480 may provide the repair signal RPR to the CPU 110 based on the fault attribute signal FAS and the accumulated second syndromes.

The UE determiner 470 and the repair signal generator 480 may refer to the accumulated second syndromes in the syndrome accumulation register 460 to determine a second attribute of the memory region associated with the correctable errors. The second attribute may indicate whether error occurrence pattern in the symbol is associated with a burst length direction or data input/output pad direction. The second attribute may be associated with a cause of the errors in the memory region.

For example, when the second attribute is associated with the burst length direction, it is determined that the errors occur due to fault of sub word-line drivers disposed in each of sub array blocks in the memory cell array 300 in FIG. 4. For example, when the second attribute is associated with the data input/output pad direction, it is determined that the errors occur due to fault of data input/output pad through which data is input and output.

That is, the error manager 430 may determine the first attribute of the correctable errors based on the counting value CV to generate the fault attribute signal FAS indicating the first attribute, may store the second syndrome SDR_M associated with the correctable error, obtained through one read operation, may store the second syndromes associated with the correctable errors, obtained through the plurality of read operations, by accumulating the second syndromes SDR_M, may generate the uncorrectable error information UEI predicting occurrence of the uncorrectable error based on the accumulated second syndromes, may provide the alert signal ALRT to the CPU 110 based on the uncorrectable error information UEI and may provide the repair signal RPR to the CPU 110 based on the fault attribute signal FAS and the accumulated second syndromes.

FIG. 20 illustrates an example of the syndrome register in the error manager of FIG. 19 according to example embodiments.

Referring to FIG. 20, a syndrome register 450a may temporarily the second syndrome SDR_M associated with the correctable errors detected through one (current) read operation. The syndrome register 450a may store the second syndrome SDR_M associated with the correctable errors detected through a current read operation.

The data corrector 155 in the ECC decoder 150 of FIG. 14 stores the second syndrome SDR_M in the error managing circuit 400 when the correctable error by unit of symbol occurs in the user data set SDQ, the second syndrome SDR_M stored in the syndrome register 450a may represent one of symbols in the user data set SDQ. The second attribute may be determined by arranging the second syndrome SDR_M along the data input/output pad direction DQP and the burst length direction BL in the syndrome register 450a.

FIG. 21 illustrates an example of the syndrome accumulation register in the error manager of FIG. 19 according to some example embodiments.

Referring to FIG. 21, a syndrome accumulation register 460a may accumulate the second syndromes associated with the correctable errors, obtained through the plurality of read operations to store accumulated syndrome SDR_M ACM therein. That is, the syndrome accumulation register 460a may store error count of each bit of each of symbols in which the correctable errors occur, obtained through the plurality of read operations. The UE determiner 470 may determine possibility of occurrence of uncorrectable errors by comparing accumulated error count of each bit with a reference value. The second attribute may be determined based on the accumulated error count of each bit in the syndrome accumulation register 460a. In FIG. 21, it is noted that the correctable errors repeatedly occur in a specific burst length direction BL. That is, in FIG. 21, it is noted that the second attribute is associated with a sub word-line driver.

Figure 22:
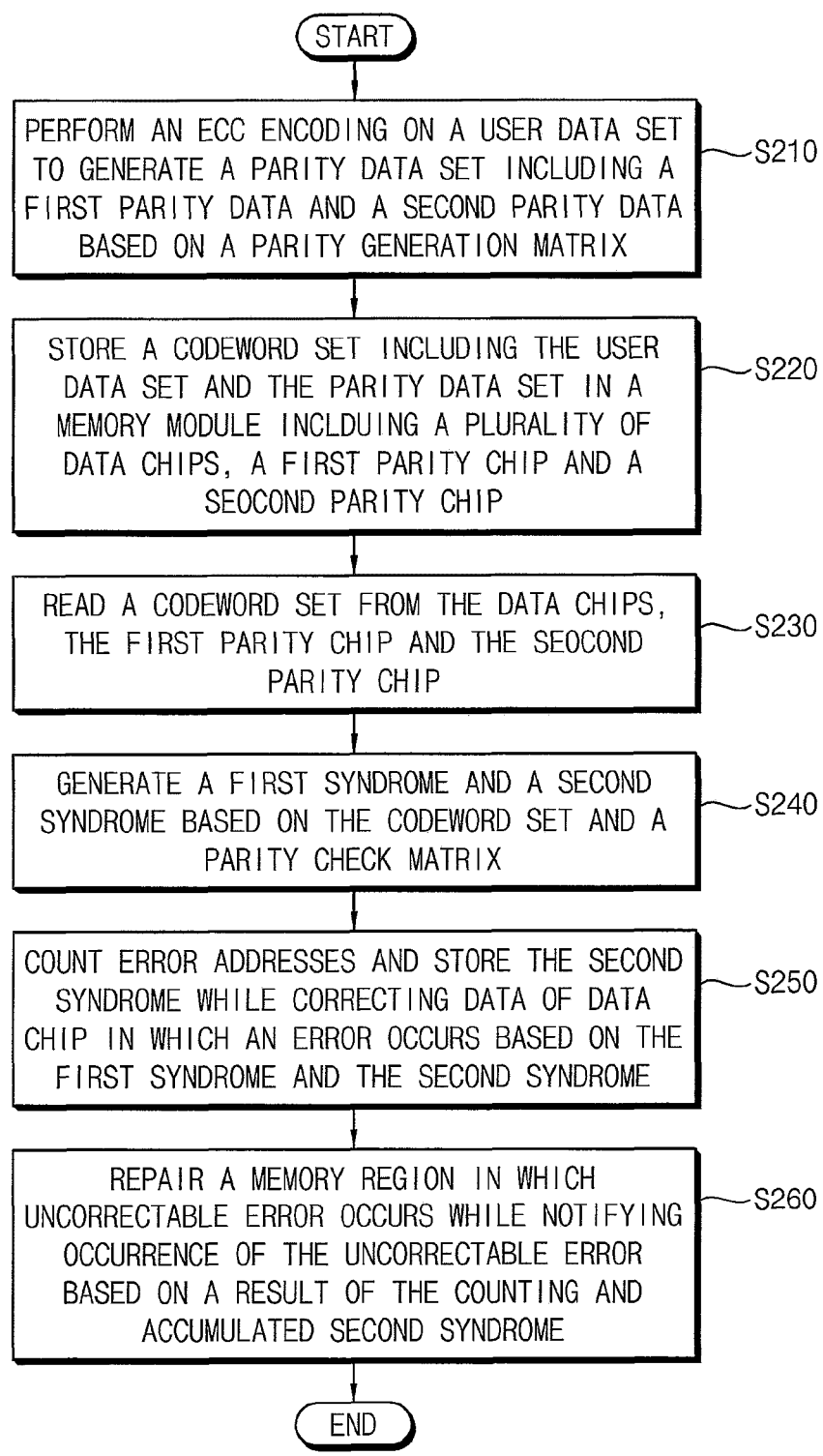
FIG. 22 is a flow chart illustrating a method of operating a memory system according to some example embodiments.

FIG. 22 is a flow chart illustrating a method of operating a memory system according to example embodiments.

Referring to FIGS. 1 through 22, there is provided a method of operating a memory system 20 that includes a memory module MM including a plurality of data chips, a first parity chip and a second parity chip and a memory controller 100 that controls the memory module MM. According to the method, an ECC encoder 140 of an ECC engine 130 in the memory controller 100 preforms an ECC encoding on a user data set SDQ and a meta data MDT based on a parity generation matrix PGM to generate a parity data set SPRT including a first parity data PRTL and a second parity data PRTM (operation S210).

The memory controller 100 stores a codeword set SCW1 including the user data set SDQ, the meta data MDT and the parity data set SPRT in the plurality of data chips 200a~200k, the first parity chip and the second parity chip (operation S220).

The memory controller 100 may read a codeword set SW2 including the user data set SDQ, the meta data MDT and the parity data set SPRT from the memory module MM (operation S230). An ECC decoder 150 of the ECC engine 130 generates a first syndrome SDR_L and a second syndrome SDR_M based on the read codeword set SCW2 and the parity check matrix PCM (operation S240).

The ECC decoder 150 stores the second syndrome SDR_M associated with correctable errors in an error managing circuit 400 while correcting the correctable errors by unit of symbol based on the first syndrome SDR_L and the second syndrome SDR_M (operation S250). The error managing circuit 400 may store the second syndromes SDR_M associated with the correctable errors, obtained through a plurality of read operations by accumulating the second syndromes, may predict occurrence of uncorrectable error and generate a repair signal for repairing a memory region associated with the correctable errors (operation S260), and may provide the repair signal RPR to the CPU 110.

Therefore, according to the method, the error managing circuit 400 may count error addresses associated with correctable errors, may store the second syndromes associated with the correctable errors by accumulating the second syndromes, may determine attribute of the correctable errors based on a result of the counting and the accumulation of the second syndromes, and may determine an error management policy on at least one memory region associated with the correctable errors, of the plurality of data chips.

Figure 23:
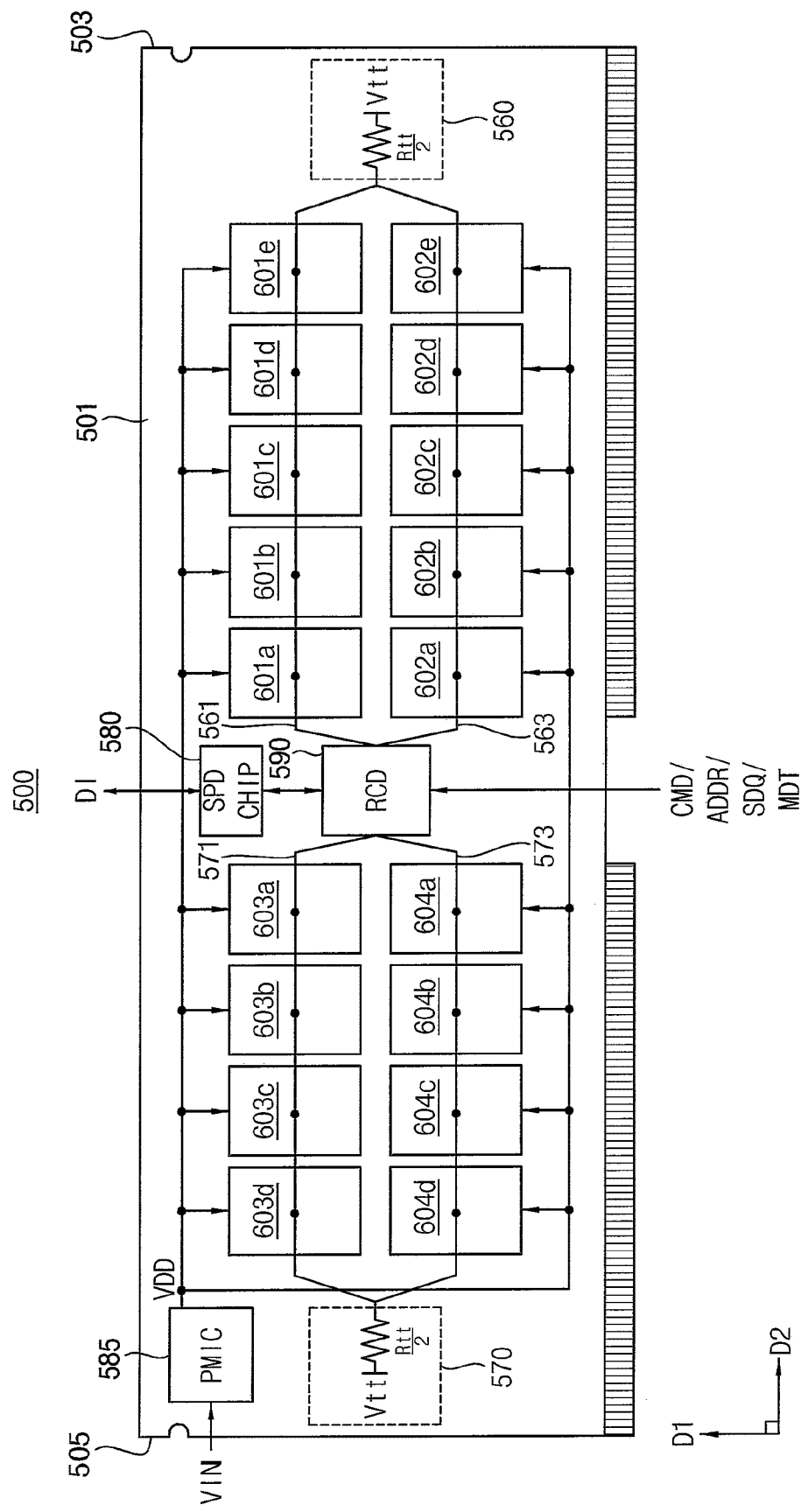
FIG. 23 is a block diagram illustrating a memory module that may be employed by the memory system according to some example embodiments.

FIG. 23 is a block diagram illustrating a memory module that may be employed by the memory system according to example embodiments.

Referring to FIG. 23, a memory module 500 includes a buffer chip 590 (RCD, registered clock driver) disposed in or mounted on a circuit board 501, a plurality of semiconductor memory devices 601a~601e, 602a~602e, 603a~603d, and 604a~604d, module resistance units 560 and 570, a serial present detect (SPD) chip 580, and/or a power management integrated circuit (PMIC) 585.

The buffer chip 590 may control the semiconductor memory devices 601a~601e, 602a~602e, 603a~603d, and 604a~604d, and the PMIC 585, under control of the memory controller 100. For example, the buffer chip 590 may receive an address ADDR, a command CMD, a user data set SDQ and a meat data MDT from the memory controller 100.

The SPD chip 580 may be a programmable read only memory (PROM) (e.g., an electrically erasable PROM (EEPROM)). The SPD chip 580 may include initial information and/or device information DI of the memory module 500. In some example embodiments, the SPD chip 580 may include the initial information and/or the device information DI such as a module form, a module configuration, a storage capacity, a module type, an execution environment, and/or the like of the memory module 500.

When a memory system including the memory module 500 is booted up, the memory controller 100 may read the device information DI from the SPD chip 580 and may recognize the memory module 500 based on the device information DI. The memory controller 100 may control the memory module 500 based on the device information DI from the SPD chip 580. For example, the memory controller 100 may recognize a type of the semiconductor memory devices included in the memory module 500 based on the device information DI from the SPD chip 580.

Here, the circuit board 501 which is a printed circuit board may extend in a second direction D2, perpendicular to a first direction D1, between a first edge portion 503 and a second edge portion 505. The first edge portion 503 and the second edge portion 505 may extend in the first direction D1.

The buffer chip 590 may be disposed on a center of the circuit board 501. The plurality of semiconductor memory devices 601a~601e, 602a~602e, 603a~603d, and 604a~604d may be arranged in a plurality of rows between the buffer chip 590 and the first edge portion 503, and between the buffer chip 590 and the second edge portion 505. According to some example embodiments, operations described herein as being performed by the buffer chip 590 may be performed by processing circuitry.

In this case, the semiconductor memory devices 601a~601e and 602a~602e may be arranged along a plurality of rows between the buffer chip 590 and the first edge portion 503. The semiconductor memory devices 603a~603d and 604a~604d may be arranged along a plurality of rows between the buffer chip 590 and the second edge portion 505. The semiconductor memory devices 601a~601d, 602a~602d, 603a~603d, and 604a~604d may be referred to as data chips, and the semiconductor memory devices 601e and 602e may be referred to as first and second parity chips, respectively.

The buffer chip 590 may generate a first parity data and a second parity data based on the user data set SDQ and the meta data MDT, may store the user data set SDQ and the meta data MDT in the data chip, may store the first parity data in the first parity chip and may store the second parity data in the second parity chip.

The buffer chip 590 may provide a command/address signal (e.g., CA) to the semiconductor memory devices 601a~601e through a command/address transmission line 561, and may provide a command/address signal to the semiconductor memory devices 602a~602e through a command/address transmission line 563. In addition, the buffer chip 590 may provide a command/address signal to the semiconductor memory devices 603a~603d through a command/address transmission line 571, and may provide a command/address signal to the semiconductor memory devices 604a~604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505. Each of the module resistance units 560 and 570 may include a termination resistor Rtt/2 connected to a termination voltage Vtt.

In addition, each of or at least one of the plurality of semiconductor memory devices 601a~601e, 602a~602e, 603a~603d, and 604a~604d may be or include a DRAM device.

The SPD chip 580 is disposed to be adjacent to the buffer chip 590 and the PMIC 585 may be disposed between the semiconductor memory device 603d and the second edge portion 505. The PMIC 585 may generate the power supply voltage VDD based on the input voltage VIN and may provide the power supply voltage VDD to the semiconductor memory devices 601a~601e, 602a~602e, 603a~603d, and 604a~604d.

Figure 24:
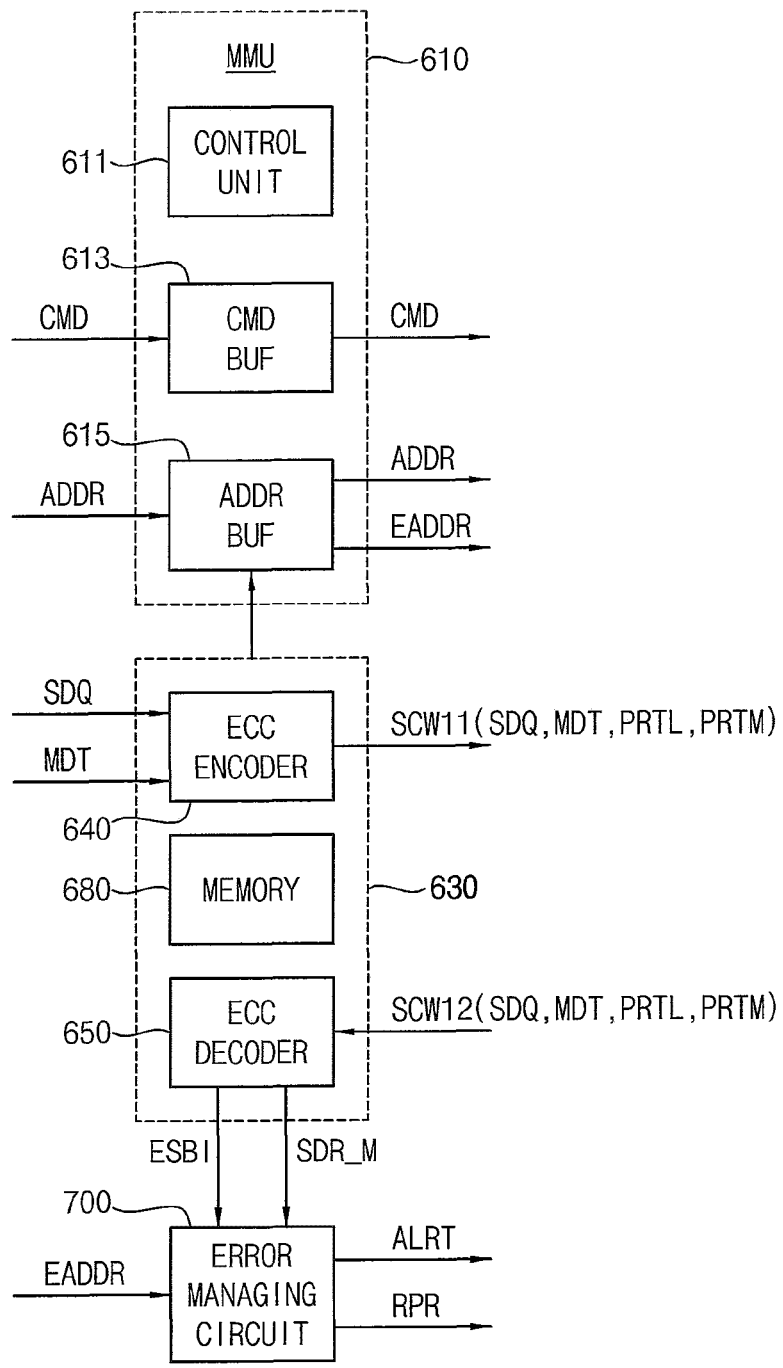
FIG. 24 is a block diagram illustrating an example of the buffer chip in the memory module of FIG. 23 according to some example embodiments.

FIG. 24 is a block diagram illustrating an example of the buffer chip in the memory module of FIG. 23 according to example embodiments.

Referring to FIG. 24, the buffer chip 590 may include a memory management unit (MMU) 610, an ECC engine 630 and an error managing circuit 700.

The MMU 610 may repeat the command CMD and the address ADDR from the memory controller 100 to the semiconductor memory devices 601a~601e, 602a~602e, 603a~603d, and 604a~604d. The MMU 610 may include a control unit 611, a command buffer (CMF BUF) 613 and an address buffer (ADDR BUF) 615. The control unit 611 controls the command buffer 613 and the address buffer 615 to control buffering timing of the command CMD and the address ADDR. The address buffer 615 may provide the error managing circuit 700 with an address associated with correctable errors as an error address EADDR under control of the control unit 511.

The ECC engine 630 may include an ECC encoder 640, an ECC decoder 650, and a memory 680. The ECC encoder 640 performs an ECC encoding on the user data set SDQ and the meta data MDT using a parity generation matrix to generate a codeword set SCW11 including the data set SDQ, the meta data MDT, a first parity data PRTL and a second parity data PRTM in a write operation.

The ECC decoder 650 performs an ECC decoding on a codeword set SCW12 including the user data set SDQ, the meta data MDT, the first parity data PRTL and the second parity data PRTM using a parity check matrix to generate a first syndrome and a second syndrome. The ECC decoder 650 may correct correctable error in the user data set SDQ in the codeword set SCW12 by units of symbols based on the first syndrome and the second syndrome and provide a corrected user data set to the memory controller 100. The ECC decoder 650 may provide the error managing circuit 700 with a second syndrome SDR_M associated with the correctable errors and error symbol information SBI associated with a symbol in which the correctable error occurs.

The memory 680 may store the parity generation matrix and the parity check matrix. The ECC engine 630 may employ the ECC engine 130 of FIG. 6.

The error managing circuit 700 may count error addresses EADDR provided from the address buffer 615 and associated with correctable errors detected in a plurality of read operations on the memory module MM, may store the second syndromes SDR_M associated with the correctable errors by accumulating the second syndromes SDR_M, may determine attribute of the correctable errors based on a result of the counting and the accumulation of the second syndromes, and may determine an error management policy on at least one memory region associated with the correctable errors. The error managing circuit 700 may provide the MMU 610 with an alert signal ALRT notifying a possibility of the occurrence of uncorrectable errors based on the attribute.

Figure 25:
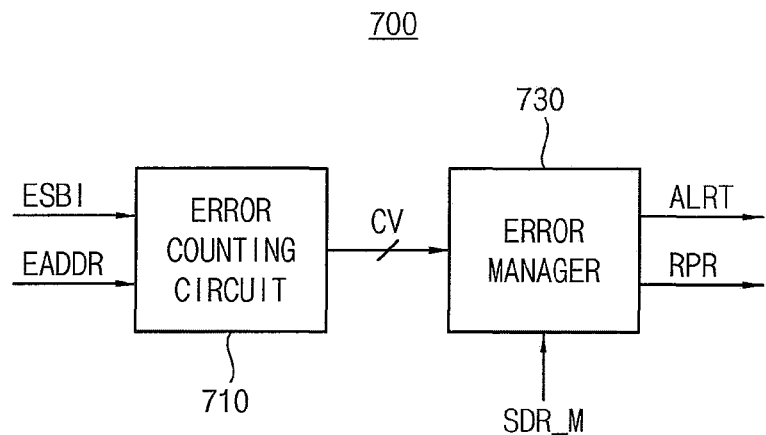
FIG. 25 is a block diagram illustrating an example of an error managing circuit in the buffer chip of FIG. 24 according to some example embodiments.

FIG. 25 is a block diagram illustrating an example of an error managing circuit in the buffer chip of FIG. 24 according to example embodiments.

Referring to FIG. 25, the error managing circuit 700 may include an error counting circuit 710 and an error manager 730.

The error counting circuit 710 may count the error addresses EADDR based on the error symbol information ESBI indicating a symbol in which the correctable errors occur to output a counting value CV.

The error manager 730 may receive the counting value CV and the second syndrome SDR_M. The error manager 730 may determine a first attribute (e.g. attribute about physical location in which the correctable errors occur) of the correctable errors based on the counting value CV, may generate a repair signal RPR for repairing the at least one memory region based on the first attribute and the accumulation of the second syndromes, and may predict occurrence of uncorrectable error in the at least one memory region based on the accumulation of the second syndromes to provide the MMU 610 with an alert signal ALRT associated with the prediction The error manager 730 may provide the alter repair signal RPR to the MMU 610 and the MMU 610 may provide the data chips with aa address to be repaired.

The error counting circuit 710 may employ the error counting circuit 405 in FIG. 16 and the error manager 730 may employ the error manager 430 of FIG. 19. Therefore, the memory module 500 may count error addresses associated with correctable errors, may store the second syndromes associated with the correctable errors by accumulating the second syndromes, may determine at least one attribute of the correctable errors based on a result of the counting and the accumulation of the second syndromes, and may determine an error management policy on at least one memory region associated with the correctable errors.

Figure 26:
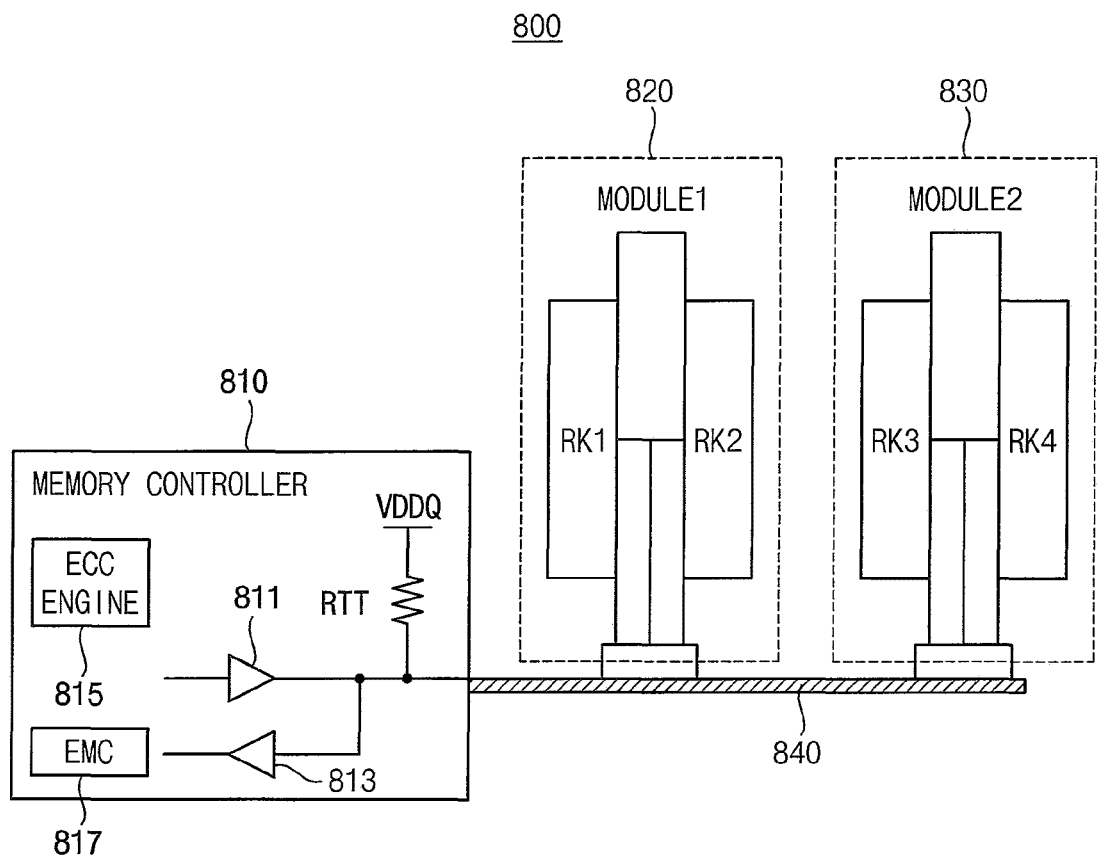
FIG. 26 is a block diagram illustrating a memory system having quad-rank memory modules according to some example embodiments.

FIG. 26 is a block diagram illustrating a memory system having quad-rank memory modules according to some example embodiments.

Referring to FIG. 26, a memory system 800 may include a memory controller 810 and/or memory modules 820 and 830. While two memory modules are depicted in FIG. 26, more or fewer memory modules may be included in the memory system 800, according to some example embodiments.

The memory controller 810 may control a memory module 820 and/or 830 so as to perform a command supplied from a processor and/or a host. The memory controller 810 may be implemented using processing circuitry (e.g., a processor) and/or may be implemented with a host, an application processor or a system-on-a-chip (SoC). For signal integrity, a source termination may be implemented with a resistor RTT on a bus 840 of the memory controller 810. The resistor RTT may be coupled to a power supply voltage VDDQ. The memory controller 810 may include a transmitter 811, that may transmit a signal to at least one of the memory modules 820 and/or 830, and a receiver 813 that may receive a signal from at least one of the memory modules 820 and/or 830. The memory controller 810 may include an ECC engine 815 and the error managing circuit (EMC) 817. The ECC engine 815 may employ the ECC engine 130 of FIG. 6 and the error managing circuit 817 may employ the error managing circuit 400 of FIG. 15.

Therefore, the ECC engine 815 includes an ECC encoder and an ECC decoder, and the ECC decoder may perform an ECC decoding on a read codeword from at least one of the memory modules 820 and/or 830 to generate a first syndrome and a second syndrome, and may provide the error managing circuit with an error address associated with a correctable error and the second syndrome.

The error managing circuit 817 may determine at least one attribute of the correctable errors based on counting the error addresses and accumulation of the second syndromes, and may determine an error management policy on a memory region associated with the correctable errors. Therefore, the error managing circuit 817 may prevent, or reduce the likelihood of occurrence of, uncorrectable errors due to accumulated correctable errors in the memory modules 820 and 830. Therefore, the memory system 800 may more efficiently correct and manage errors.

The memory modules 820 and 830 may be referred to as a first memory module 820 and a second memory module 830. The first memory module 820 and the second memory module 830 may be coupled to the memory controller 810 through the bus 840. Each of the first memory module 820 and the second memory module 830 may correspond to the memory module MM in FIG. 1. The first memory module 820 may include memory ranks RK1 and RK2, and the second memory module 830 may include memory ranks RK3 and RK4.

Each of the first memory module 820 and the second memory module 830 may include a plurality of data chips, a first parity chip, and a second parity chip.

Figure 27:
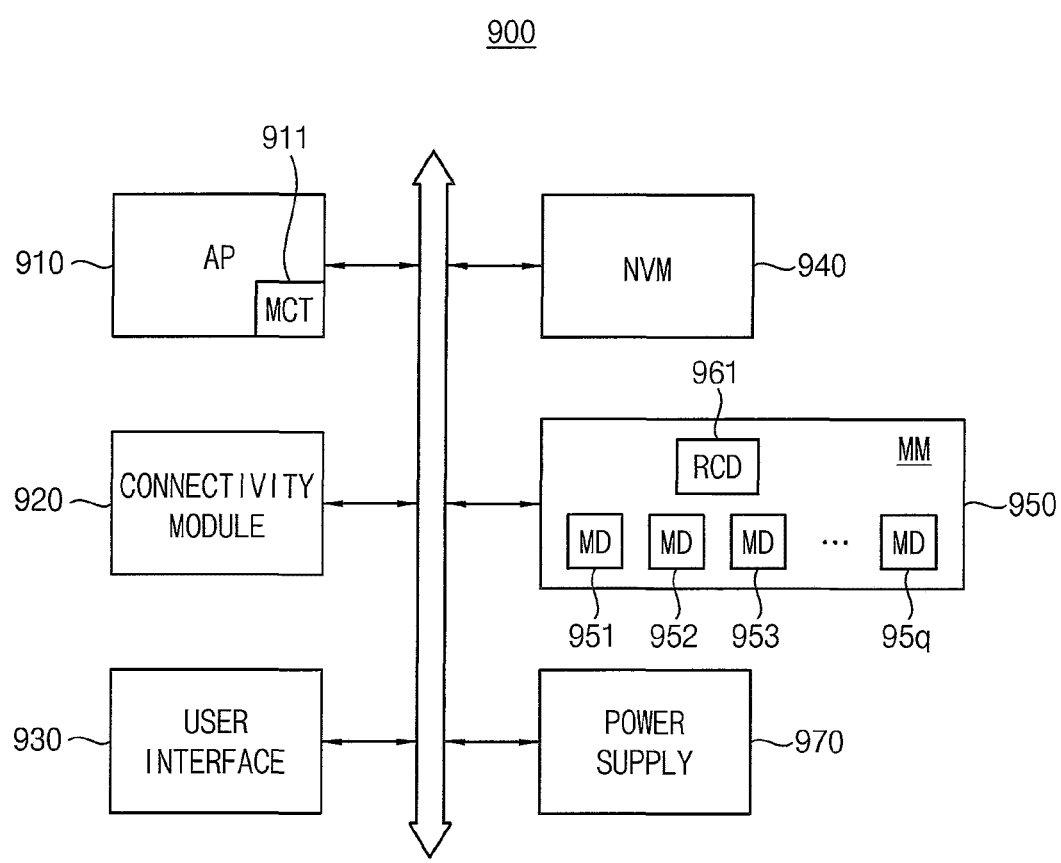
FIG. 27 is a block diagram illustrating a mobile system including a memory module according to some example embodiments.

FIG. 27 is a block diagram illustrating a mobile system including a memory module according to some example embodiments.

Referring to FIG. 27, a mobile system 900 may include an application processor (AP) 910, a connectivity module 920, a memory module (MM) 950 such as a DIMM, a nonvolatile memory device 940, a user interface 930, and/or a power supply 970. The application processor 910 may include a memory controller 911. The memory controller 911 may include the ECC engine 130 of FIG. 6 and the error managing circuit 400 of FIG. 15.

The application processor 910 may execute applications, such as at least one of a web browser, a game application, a video player, etc. The connectivity module 920 may perform wired and/or wireless communication with an external device.

The memory module 950 may store data processed by the application processor 910 and/or operate as a working memory. The memory module 950 may include a plurality of semiconductor memory devices (MD) 951, 952, 953, and 95q (where q is a positive integer greater than three), and/or a buffer chip (RCD) 961.

The semiconductor memory devices 951, 952, 953, and 95q may include a plurality of data chips, a first parity chip, and a second parity chip. Therefore, the memory controller 911 may perform an ECC decoding on a read codeword from the memory module 950 to generate a first syndrome and a second syndrome and may provide the error managing circuit with an error address associated with a correctable error and the second syndrome. The error managing circuit may determine an attribute or a plurality of attributes of the correctable errors based on counting the error addresses and accumulation of the second syndromes, and may determine an error management policy on a memory region associated with the correctable errors.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

The mobile system 900 or components of the mobile system 900 may be mounted using various types of packages.

Some example embodiments may be applied to various systems including a memory module and/or a memory controller that includes an ECC engine.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

The mobile system 900 or at least some components of the mobile system 900 may be mounted using various types of packages.

Some example embodiments may be applied to various systems including a memory module and/or a memory controller that includes an ECC engine.

As used herein, unless otherwise specified elements such as "engines" and/or "modules" and/or "units", and/or elements ending in "-er" or "-or" may be or may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A memory controller circuitry configured to control a memory module, the memory module including a plurality of data chips, a first parity chip and a second parity chip, the memory controller circuitry comprising:
an error correction code (ECC) engine circuitry;
a central processing unit (CPU) configured to control the ECC engine circuitry; and
an error management circuitry,
wherein the memory controller circuitry is configured to:
perform an ECC decoding on a read codeword set from the memory module to generate a plurality of syndromes, the plurality of syndromes including both a first syndrome and a second syndrome,
correct a correctable error in a user data set in the read codeword set based on the first syndrome and on the second syndrome,
of the first syndrome and the second syndrome, provide the error management circuitry with only the second syndrome associated with the correctable error,
count error addresses associated with correctable errors detected through a plurality of read operations,
store the second syndromes associated with the correctable errors by accumulating the second syndromes,
determine a first attribute of the correctable errors based on a result of the counting and on the accumulation of the second syndromes,
determine an error management policy on at least one memory region associated with the correctable errors, the at least one memory region associated with the plurality of data chips, and
apply the error management policy to the at least one memory region,
wherein the first attribute of the correctable errors includes information about physical locations of the correctable errors,
wherein the memory controller circuitry is configured to:
count the error addresses based on error symbol information to output a counting value, the error symbol information indicating a symbol in which the correctable errors occur,
determine the first attribute of the correctable errors based on the counting value, generate a repair signal for repairing the at least one memory region based on the first attribute and the accumulation of the second syndromes, and predict occurrence of uncorrectable error in the at least one memory region based on the accumulation of the second syndromes to provide the CPU with an alert signal associated with the prediction.

2. The memory controller circuitry of claim 1, wherein the error management circuitry includes:

an error address register configured to store the error addresses and the error symbol information, and the error management circuitry is configured to compare a previous error address and a current error address to output an address comparison signal indicating a result of the comparison, the previous error address including error symbol information associated with a previous read operation among the read operations, the current error address including error symbol information associated with a current read operation among the read operations, and receive the address comparison signal to output the counting value based on a plurality of bits in the address comparison signal.

3. The memory controller circuitry of claim 2, wherein the error management circuitry further includes:

a first counter configured to first output a first sub counting value associated with a row address of the memory region, the first outputting based on the address comparison signal;

a second counter configured to second output a second sub counting value associated with a column address of the memory region, the second outputting based on the address comparison signal;

a third counter configured to third output a third sub counting value associated with a bank address of the memory region, the third outputting based on the address comparison signal; and a fourth counter configured to fourth output a fourth sub counting value associated with a memory chip including the memory region, the fourth outputting based on the address comparison signal.

4. The memory controller circuitry of claim 3, wherein the counting value includes the first sub counting value, the second sub counting value, the third sub counting value and the fourth sub counting value.

5. The memory controller circuitry of claim 1, wherein the error management circuitry is configured to:

determine the first attribute based on the counting value to generate a fault attribute signal indicating the first attribute, store the second syndrome associated with the correctable error, obtained through one read operation;

store the second syndromes associated with the correctable errors, obtained through the plurality of read operations, by accumulating the second syndromes;

generate an uncorrectable error information predicting occurrence of the uncorrectable error based on the accumulated second syndromes;

provide the alert signal to the CPU based on the uncorrectable error information; and provide the repair signal to the CPU based on the fault attribute signal and the accumulated second syndromes.

6. The memory controller circuitry of claim 5, wherein the error management circuitry is configured to provide the alert signal in response to a number of the correctable errors occurring in the memory region exceeding a reference value, the alert signal provided by referring to the accumulated second syndromes.

7. The memory controller circuitry of claim 5, wherein the error management circuitry is configured to determine a second attribute of the correctable errors based on the fault attribute signal and the accumulated second syndromes, and to provide the repair signal to the CPU based on the second attribute.

8. The memory controller circuitry of claim 1, wherein the error management circuitry is configured to:

determine the first attribute based on the counting value to generate a fault attribute signal indicating the first attribute, and the error management circuitry includes a syndrome register configured to store the second syndrome associated with the correctable error, obtained through one read operation, a syndrome accumulation register, connected to the syndrome register, configured to store the second syndromes associated with the correctable errors, obtained through the plurality of read operations, by accumulating the second syndromes, and the error management circuitry is configured to:

to generate an uncorrectable error information predicting occurrence of the uncorrectable error based on the accumulated second syndromes, provide the alert signal to the CPU based on the uncorrectable error information, and provide the repair signal to the CPU based on the fault attribute signal and the accumulated second syndromes.

9. The memory controller circuitry of claim 8, further comprising:

an uncorrectable error determining circuitry configured to provide the uncorrectable error information to provide the alert signal based on a comparison of a number of the correctable errors by unit of symbol with a reference value by referring to the accumulated second syndromes.

10. The memory controller circuitry of claim 1, wherein the ECC engine circuitry includes:

an ECC memory configured to store a parity check matrix; and the ECC engine circuitry is configured to perform an ECC decoding on the read codeword set to generate the first syndrome and the second syndrome and configured to provide the error management circuitry with the second syndromes and the error addresses associated with the correctable errors.

11. The memory controller circuitry of claim 10, wherein the ECC engine circuitry is configured to determine that the correctable error occurs in one of the plurality of data chips in response to the first syndrome being non-zero and the second syndrome being non-zero.

12. The memory controller circuitry of claim 10, wherein:

the read codeword set includes a user data set, metadata associated with the user data set, a first parity data associated with locations of bit errors in the user data set, and second parity data associated with a quantity of the bit errors;

the user data set is read from the plurality of data chips, the meta data and the first parity data are read from the first parity chip and the second parity data is read from the second parity chip; and the parity check matrix includes a first parity sub matrix, a second parity sub matrix and a third parity sub matrix.

13. The memory controller circuitry of claim 12, wherein the ECC engine circuitry is configured to:
   generate the first syndrome by performing matrix-multiplication operation on the read codeword set and the first parity sub matrix; and
   generate the second syndrome by performing matrix-multiplication operation on the read codeword set and the second sub parity matrix and the third parity sub matrix.

14. A memory system comprising:
   a memory module including a plurality of data chips, a first parity chip, and a second parity chip; and
   a memory controller circuitry configured to control the memory module,
      wherein the memory controller circuitry comprises an error correction code (ECC) engine, and
   a central processing unit (CPU) configured to control the ECC engine
   wherein the memory controller circuitry is configured to
   perform an ECC decoding on a read codeword set from the memory module to generate a plurality of error syndromes including both a first syndrome and a second syndrome in a read operation,
   correct a correctable error in a user data set in the read codeword set based on the first syndrome and on the second syndrome,
   count error addresses associated with correctable errors detected through a plurality of read operations,
   of the first syndrome and the second syndrome, accumulate the second syndromes associated with the correctable errors to store the second syndromes,
   determine a first attribute of the correctable errors based on comparison of a result of the counting and the accumulation of the second syndromes,
   determine an error management policy on at least one memory region associated with the correctable errors, of the plurality of data chips, and
   apply the error management policy to the at least one memory region, wherein
   the first attribute of the correctable errors includes information about physical locations of the correctable errors,
   wherein the memory controller circuitry is configured to:
   count the error addresses based on error symbol information to output a counting value, the error symbol information indicating a symbol in which the correctable errors occur,
   determine the first attribute of the correctable errors based on the counting value,
   generate a repair signal for repairing the at least one memory region based on the first syndrome and the accumulation of the second syndromes, and
   predict occurrence of uncorrectable errors in the at least one memory region based on the accumulation of the second syndromes to provide the CPU with an alert signal associated with the prediction.

15. The memory system of claim 14, wherein the memory controller circuitry is configured to:
   determine the first attribute based on the counting value to generate a fault attribute signal indicating the first attribute,
   store the second syndrome associated with the correctable error, obtained through one read operation,
   accumulate the second syndromes associated with the correctable errors, obtained through the plurality of read operations, to store the second syndromes;
   generate an uncorrectable error information predicting occurrence of the uncorrectable error based on the accumulated second syndromes,
   provide the alert signal to the CPU based on the uncorrectable error information; and
   provide the repair signal to the CPU based on the fault attribute signal and the accumulated second syndromes.

16. The memory system of claim 14, wherein:
   the read codeword set includes a user data set, metadata associated with the user data set, a first parity data associated with locations of bit errors in the user data set, and second parity data associated with a quantity of the bit errors; and
   the user data set is read from the plurality of data chips, the meta data and the first parity data are read from the first parity chip and the second parity data is read from the second parity chip.

17. A memory module comprising:
   a plurality of data chips configured to store a user data set and meta data;
   a first parity chip configured to store a first parity data;
   a second parity chip configured to store a second parity data, the first parity data and the second parity data being generated based on the user data set and the meta data; and
   a buffer chip configured to provide the user data set and the meta data to the plurality of data chips based on a command and an address provided from an external memory controller and configured to provide the first parity data and the second parity data to the first parity chip and the second parity chip, respectively,
   wherein the buffer chip includes:
   an error correction code (ECC) engine circuitry;
   a memory management circuitry configured to control the ECC engine circuitry; and
   an error management circuitry,
   wherein the ECC engine circuitry is configured to:
   perform an ECC decoding on a read codeword set from the plurality of data chips, the first parity chip, and the second parity chip so as to generate a plurality of syndromes including both a first syndrome and a second syndrome in a read operation;
   correct a correctable error in a user data set in the read codeword set based on the first syndrome and the second syndrome; and
   of the first syndrome and the second syndrome, provide the error management circuitry with only the second syndrome associated with the correctable error, and
   wherein the error management circuitry is configured to,
   count error addresses associated with correctable errors detected through a plurality of read operations,
   store second syndromes associated with the correctable errors by accumulating the second syndromes,
   determine a first attribute of the correctable errors based on comparison of a result of the counting and the accumulation of the second syndromes,
   determine an error management policy on at least one memory region associated with the correctable errors, of the plurality of data chips, and
   apply the error management policy to the at least one memory region, wherein
   the attribute of the correctable errors includes information about physical locations of the correctable errors,
   wherein the error management circuitry is configured to count the error addresses based on error symbol information to output a counting value, the error symbol information indicating a symbol in which the correctable errors occur, determine the first attribute of the correctable errors based on the counting value, generate a repair signal for repairing the at least one memory region based on the first syndrome and the accumulation of the second syndromes, and predict occurrence of uncorrectable error in the at least one memory region based on the accumulation of the second syndromes to provide the memory management circuitry with an alert signal associated with the prediction.

\* \* \* \* \*